United States Patent
Ito et al.

(10) Patent No.: US 7,532,069 B2
(45) Date of Patent: May 12, 2009

(54) DIFFERENTIAL AMPLIFYING CIRCUIT

(75) Inventors: Tomohiko Ito, Yokohama (JP); Tetsuro Itakura, Nerima-ku (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/173,431

(22) Filed: Jul. 15, 2008

(65) Prior Publication Data

US 2008/0284634 A1    Nov. 20, 2008

Related U.S. Application Data

(63) Continuation of application No. 11/618,071, filed on Dec. 29, 2006, now Pat. No. 7,414,472.

(30) Foreign Application Priority Data

Mar. 10, 2006  (JP) ............................. 2006-066639

(51) Int. Cl.
    *H03F 3/45*     (2006.01)
(52) U.S. Cl. ...................... 330/253; 330/261
(58) Field of Classification Search ................ 330/253, 330/254, 257, 261
    See application file for complete search history.

(56) References Cited

U.S. PATENT DOCUMENTS

| 5,986,507 | A | 11/1999 | Itakura et al. | |
|---|---|---|---|---|
| 6,356,153 | B1 * | 3/2002 | Ivanov et al. | 330/253 |
| 6,590,452 | B1 * | 7/2003 | van Rhijn | 330/253 |
| 6,825,721 | B2 * | 11/2004 | Sanchez et al. | 330/253 |

FOREIGN PATENT DOCUMENTS

| JP | 2000-151302 | 5/2000 |
|---|---|---|
| KR | 10-0241202 | 2/2000 |

OTHER PUBLICATIONS

Chiu, et al., A 14-b 12-MS/s CMOS Pipeline ADC with Over 100-dB SFDR, IEEE Journal of Solid-State Circuits, vol. 39, No. 12, pp. 2139-2151, Dec. 2004.

Yao, et al., A 1-V 140-uW 88-dB Audio Sigma-Delta Modulator in 90-nm CMOS, IEEE Journal of Solid-State Circuits, vol. 39, No. 11, pp. 1809-1818, Nov. 2004.

Kurose, et al., 55-mW 200-MSPS 10-bit Pipeline ADCs for Wireless Receivers, Proceedings of ESSCIRC, Grenoble, pp. 527-530, France 2005.

Sumanen, et al., A 10-vit 200-MS/s CMOS Parallel A/D Converter, IEEE Journal of Solid-State Circuits, vol. 36, No. 7, pp. 1048-1055, Jul. 2001.

* cited by examiner

*Primary Examiner*—Henry K Choe
(74) *Attorney, Agent, or Firm*—Amin, Turocy & Calvin, LLP

(57) ABSTRACT

Disclosed is a differential amplifying circuit including an amplifying circuit, wherein 1) a drain of a sixth transistor is connected to a drain of an eighth transistor, and a drain of a tenth transistor is connected to a drain of a fourth transistor, and 2) a ratio between a total of gate widths of the fourth (or eighth) and tenth (or sixth) transistors (converted per unit gate length, and gate widths that follow are the same) and a gate width of a fifth (or ninth) transistor is nearly proportional to a current ratio between a first (or third) and second (or fourth) current source circuits, the gate width of the fourth (or eighth) transistor being equal to or more than that of the tenth (or sixth) transistor.

20 Claims, 9 Drawing Sheets

→ ANALOG SIGNAL
⇢ DIGITAL SIGNAL

DIFFERENTIAL AMPLIFYING CIRCUIT

CROSS-REFERENCE TO RELATED APPLICATIONS

This application is based upon and claims the benefit of priority from and is a continuation of application Ser. No. 11/618,071 filed on Dec. 29, 2006, which is based upon and claims the benefit of priority from the prior Japanese Patent Application No. 2006-66639, filed on Mar. 10, 2006; the entire contents of both of which are incorporated herein by reference.

BACKGROUND OF THE INVENTION

1. Field of the Invention

The present invention relates to a differential amplifying circuit suitable for an integrated circuit.

2. Description of the Related Art

For example, to realize a high-precision pipelined A/D converter, a differential amplifying circuit with a high differential DC gain (hereinafter expressed as "DC gain") is needed. One of configurations to obtain a high DC gain in the differential amplifying circuit is a configuration including a gain boost amplifying circuit. The DC gain of the differential amplifying circuit can be increased by a DC gain of the added gain boost amplifying circuit. As an example of an A/D converter using the differential amplifying circuit including the gain boost amplifying circuit, there is one disclosed in the following related art 1.

A gain boost amplifying circuit disclosed in this related art has a configuration in which a transistor is added to adjust the output common mode voltage to a vicinity of a median value between reference electric potentials vdd and vss (hereinafter expressed as "reference potentials vdd and vss"), and power consumption increases by an amount corresponding to a current flowing through this transistor.

[Related Art 1] Yun Chiu et al., "A 14-b 12-MS/s CMOS pipeline ADC with over 100-dB SFDR", IEEE Journal of Solid-State Circuit, United States, IEEE, December 2004, Vol. 39, No. 12, pp. 2139-2151

BRIEF SUMMARY OF THE INVENTION

A differential amplifying circuit according to one aspect of the present invention includes: an input stage including a pair of differential input terminals and a pair of differential output nodes outputting differential currents according to differential voltages inputted to the pair of differential input terminals; a first intermediate stage including a first transistor and a first amplifying circuit, the first transistor having a source to which one of the pair of differential output nodes and an input side of the first amplifying circuit are connected, a gate to which an output side of the first amplifying circuit is connected, and a drain being a negative-side current output node; a second intermediate stage including a second transistor and a second amplifying circuit, the second transistor having a source to which another of the pair of differential output nodes and an input side of the second amplifying circuit are connected, a gate to which an output side of the second amplifying circuit is connected, and a drain being a positive-side current output node; and an output stage using the negative-side current output node and the positive-side current output node as a pair of differential input nodes and including a pair of differential output terminals outputting differential voltages according to differential currents inputted to the pair of differential input nodes, wherein the first amplifying circuit includes: a first and second current source circuits whose one ends are connected to a first reference potential; a third transistor having a source to which one of the differential output nodes in the input stage is connected and a gate to which a bias voltage is applied, and across which a bias current flows caused by the first current source circuit; a fourth transistor having a source connected to a second reference potential, a drain to which a current is inputted from the third transistor, and a gate connected to a drain of the third transistor; a fifth transistor having a gate and a source connected in common with those of the fourth transistor respectively and a drain to which a current from the second current source circuit is inputted; and a sixth transistor having a gate and a source connected in common with those of the fourth transistor respectively, the source of the third transistor being the input of the first amplifying circuit, and the output of the first amplifying circuit being on a drain side of the fifth transistor, the second amplifying circuit includes: a third and fourth current source circuits whose one ends are connected to the first reference potential; a seventh transistor having a source to which another of the differential output nodes in the input stage is connected and a gate to which a bias voltage is applied, and across which a bias current flows caused by the third current source circuit; an eighth transistor having a source connected to the second reference potential, a drain to which a current is inputted from the seventh transistor, and a gate connected to a drain of the seventh transistor; a ninth transistor having a gate and a source connected in common with those of the eighth transistor respectively and a drain to which a current from the fourth current source circuit is inputted; and a tenth transistor having a gate and a source connected in common with those of the eighth transistor respectively, the source of the seventh transistor being the input of the second amplifying circuit, and the output of the second amplifying circuit being on a drain side of the ninth transistor, a drain of the sixth transistor is connected to the drain of the eighth transistor, and a drain of the tenth transistor is connected to the drain of the fourth transistor, a ratio between a total of gate widths converted per unit gate length of the fourth and the tenth transistor and a gate width converted per unit gate length of the fifth transistor is nearly proportional to a current ratio between the first current source circuit and the second current source circuit, the gate width converted per unit gate length of the fourth transistor being equal to or more than the gate width converted per unit gate length of the tenth transistor, and a ratio between a total of gate widths converted per unit gate length of the eighth and the sixth transistor and a gate width converted per unit gate length of the ninth transistor is nearly proportional to a current ratio between the third current source circuit and the fourth current source circuit, the gate width converted per unit gate length of the eighth transistor being equal to or more than the gate width converted per unit gate length of the sixth transistor.

In this differential amplifying circuit, twists are added to the first and second amplifying circuits included therein. Namely, 1) the drain of the sixth transistor is connected to the drain of the eighth transistor, and the drain of the tenth transistor is connected to the drain of the fourth transistor. 2) The ratio between the total of gate widths converted per unit gate length of the fourth and the tenth transistor and a gate width converted per unit gate length of the fifth transistor is nearly proportional to the current ratio between the first current source circuit and the second current source circuit, the gate width converted per unit gate length of the fourth transistor being equal to or more than the gate width converted per unit gate length of the tenth transistor. 3) The ratio between the total of gate widths converted per unit gate length of the eighth and the sixth transistor and a gate width converted per unit gate length of the ninth transistor is nearly proportional to the current ratio between the third current source circuit and the fourth current source circuit, the gate width converted per unit gate length of the eighth transistor being equal to or more than the gate width converted per unit gate length of the sixth transistor.

Consequently, the parallel output resistance of the fourth and tenth transistors and the parallel output resistance of the eighth and sixth transistors rise, which can increase the gains of the first and second amplifying circuits. Accordingly, as the differential amplifying circuit, its DC gain can be increased by an increase in the DC gains of the first and second amplifying circuits. Incidentally, a transistor to adjust the output common mode voltage to a vicinity of a median value between reference potentials vdd and vss is unnecessary, which leads to a reduction in power consumption.

Further, a differential amplifying circuit according to another aspect of the present invention includes: an input stage including a pair of differential input terminals and a pair of differential output nodes outputting differential currents according to differential voltages inputted to the pair of differential input terminals; a first intermediate stage including a first transistor and a first amplifying circuit, the first transistor having a source to which one of the pair of differential output nodes and an input side of the first amplifying circuit are connected, a gate to which an output side of the first amplifying circuit is connected, and a drain being a negative-side current output node; a second intermediate stage including a second transistor and a second amplifying circuit, the second transistor having a source to which another of the pair of differential output nodes and an input side of the second amplifying circuit are connected, a gate to which an output side of the second amplifying circuit is connected, and a drain being a positive-side current output node; and an output stage using the negative-side current output node and the positive-side current output node as a pair of differential input nodes and including a pair of differential output terminals outputting differential voltages according to differential currents inputted to the pair of differential input nodes, wherein the first amplifying circuit includes: a first and second current source circuits whose one ends are connected to a first reference potential; a third transistor having a source to which one of the differential output nodes in the input stage is connected and a gate to which a bias voltage is applied, and across which a bias current flows caused by the first current source circuit; a fourth transistor having a source connected to a second reference potential, a drain to which a current is inputted from the third transistor, and a gate connected to a drain of the third transistor; a fifth transistor having a gate and a source connected in common with those of the fourth transistor respectively and a drain to which a current from the second current source circuit is inputted; an eleventh transistor having a source connected to the drain of the fourth transistor and a gate to which a bias voltage is applied, and across which a bias current flows caused by the first current source circuit; a twelfth transistor having a source connected to the drain of the fifth transistor, and across which a bias current flows caused by the second current source circuit; and a first sub-amplifying circuit performing amplification with the source of the eleventh transistor and the source of the twelfth transistor as bipolar inputs and supplying an output thereof to a gate of the twelfth transistor, the second amplifying circuit includes: a third and fourth current source circuits whose one ends are connected to the first reference potential; a seventh transistor having a source to which another of the differential output nodes is connected and a gate to which a bias voltage is applied, and across which a bias current flows caused by the third current source circuit; an eighth transistor having a source connected to the second reference potential, a drain to which a current is inputted from the seventh transistor, and a gate connected to a drain of the seventh transistor; a ninth transistor having a gate and a source connected in common with those of the eighth transistor respectively and a drain to which a current from the fourth current source circuit is inputted; a thirteenth transistor having a source connected to the drain of the eighth transistor and a gate to which a bias voltage is applied, and across which a bias current flows caused by the third current source; a fourteenth transistor having a source connected to the drain of the ninth transistor, and across which a bias current flows caused by the third current source; and a second sub-amplifying circuit performing amplification using the source of the thirteenth transistor and the source of the fourteenth transistor as bipolar inputs and supplying an output thereof to a gate of the fourteenth transistor, the first sub-amplifying circuit of the first amplifying circuit includes: a fifteenth transistor having a source used as one of the bipolar inputs and a gate to which a bias voltage is applied; a sixteenth transistor having a source used as another of the bipolar inputs and a gate to which a bias voltage is applied; a seventeenth transistor having a source connected to the second reference potential and a gate connected to a drain of the sixteenth transistor and outputting a drain current to the sixteenth transistor, and an eighteenth transistor having a source and a gate connected in common with those of the seventeenth transistor respectively and outputting a drain current to the fifteenth transistor, and the second sub-amplifying circuit of the second amplifying circuit includes: a nineteenth transistor having a source used as one of the bipolar inputs and a gate to which a bias voltage is applied; a twentieth transistor having a source used as another of the bipolar inputs and a gate to which a bias voltage is applied; a twenty-first transistor having a source connected to the second reference potential and a gate connected to a drain of the twentieth transistor and outputting a drain current to the twentieth transistor, and a twenty-second transistor having a source and a gate connected in common with those of the twenty-first transistor respectively and outputting a drain current to the nineteenth transistor.

In this differential amplifying circuit, another twist is added to the first and second amplifying circuits included therein. Namely, the first amplifying circuit includes the first sub-amplifying circuit performing amplification with the source of the eleventh transistor and the source of the twelfth transistor as bipolar inputs and supplying an output thereof to the gate of the twelfth transistor, and the second amplifying circuit includes the second sub-amplifying circuit performing amplification using the source of the thirteenth transistor and the source of the fourteenth transistor as bipolar inputs and supplying an output thereof to the gate of the fourteenth transistor.

Here, the first sub-amplifying circuit includes: the fifteenth transistor having the source used as one of the bipolar inputs and the gate to which the bias voltage is applied; the sixteenth transistor having the source used as the other of the bipolar inputs and the gate to which the bias voltage is applied; the seventeenth transistor having the source connected to the second reference potential and the gate connected to the drain of the sixteenth transistor and outputting the drain current to the sixteenth transistor, and the eighteenth transistor having the source and the gate connected in common with those of the seventeenth transistor respectively and outputting the drain current to the fifteenth transistor. Further, the second sub-amplifying circuit also has the same configuration.

Consequently, the gains of the first and second amplifying circuits can be increased. Accordingly, as the differential amplifying circuit, its DC gain can be increased by an increase in the DC gains of the first and second amplifying circuits. Incidentally, a transistor to adjust the output common mode voltage to a vicinity of a median value between reference potentials vdd and vss is unnecessary, which leads to a reduction in power consumption.

DETAILED DESCRIPTION OF THE INVENTION

Description of Embodiments

Figure 1:
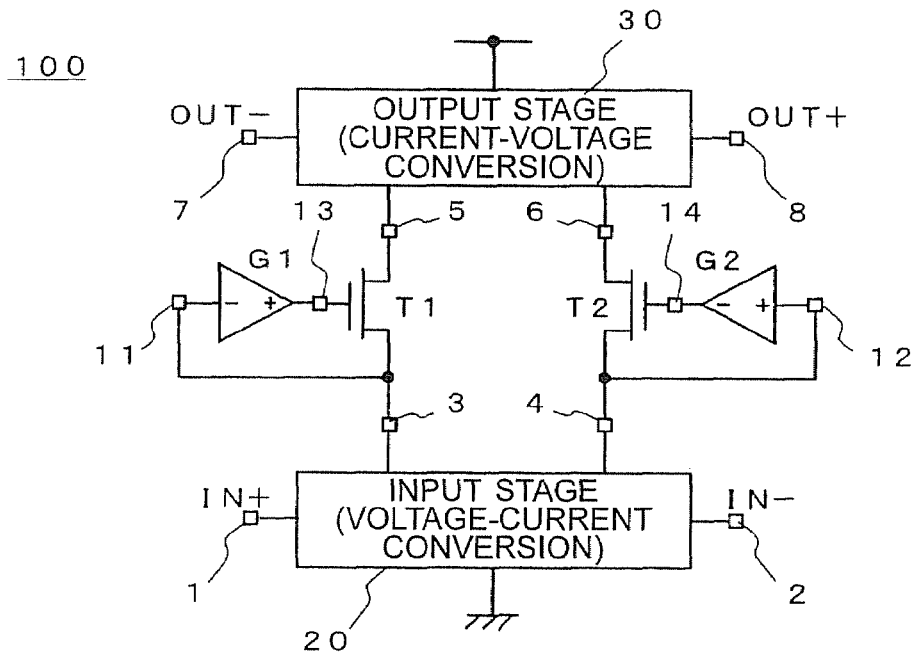
FIG. 1 is a circuit block diagram showing the schematic configuration of a differential amplifying circuit according to one embodiment.

Embodiments of the present invention will be described with reference to the drawings, but the drawings are presented only for illustrative purpose and do not limit the invention in any way.

As a form in one aspect, it can be configured that the first amplifying circuit further includes: an eleventh transistor having a source connected to the drain of the fourth transistor and a gate to which a bias voltage is applied, and across which a bias current flows caused by the first current source; and a twelfth transistor having a source connected to the drain of the fifth transistor and a gate to which a bias voltage is applied, and across which a bias current flows caused by the second current source, and the output of the first amplifying circuit being at a drain of the twelfth transistor, and the second amplifying circuit further includes: a thirteenth transistor having a source connected to the drain of the eighth transistor and a gate to which a bias voltage is applied, and across which a bias current flows caused by the third current source; and a fourteenth transistor having a source connected to the drain of the ninth transistor and a gate to which a bias voltage is applied, and across which a bias current flows caused by the fourth current source, and the output of the second amplifying circuit being at a drain of the fourteenth transistor.

This configuration can increase the gain of the first or the second amplifying circuit by the product of the transconductances of the eleventh and twelfth transistors and the output resistances thereof and by the product of the transconductances of the thirteenth and fourteenth transistors and the output resistances thereof. Consequently, as the differential amplifying circuit, its gain is further increased.

Further, as a form, it can also be configured that the first amplifying circuit further includes a twelfth transistor having a source connected to the drain of the fifth transistor and a gate to which a bias voltage is applied, and across which a bias current flows caused by the second current source, and the output of the first amplifying circuit being at a drain of the twelfth transistor, and the second amplifying circuit further includes a fourteenth transistor having a source connected to the drain of the ninth transistor and a gate to which a bias voltage is applied, and across which a bias current flows caused by the fourth current source, and the output of the second amplifying circuit being at a drain of the fourteenth transistor.

This configuration can increase the gain of the first or the second amplifying circuit by the product of the transconductance of twelfth transistor and the output resistance thereof and by the product of the transconductance of the fourteenth transistor and the output resistance thereof. Consequently, as the differential amplifying circuit, its gain is further increased.

As a form in another aspect, it can be configured that the first sub-amplifying circuit of the first amplifying circuit further includes: a twenty-third transistor having a source connected to a drain of the seventeenth transistor and a gate to which a bias voltage is applied, and across which a bias current flows caused by a drain current of the seventeenth transistor; and a twenty-fourth transistor having a source connected to a drain of the eighteenth transistor and a gate to which a bias voltage is applied, and across which a bias current flows caused by a drain current of the eighteenth transistor, and the second sub-amplifying circuit of the second amplifying circuit further includes: a twenty-fifth transistor having a source connected to a drain of the twenty-first transistor and a gate to which a bias voltage is applied, and across which a bias current flows caused by a drain current of the twenty-first transistor; and a twenty-sixth transistor having a source connected to a drain of the twenty-second transistor and a gate to which a bias voltage is applied, and across which a bias current flows caused by a drain current of the twenty-second transistor.

The gains of the first and second sub-amplifying circuits can be further increased by further including the twenty-third, twenty-fourth, twenty-fifth, and twenty-sixth transistors as described above. By increasing the gains of the first and second sub-amplifying circuits in this manner, the gains of the first and second amplifying circuits increase, and accordingly as the differential amplifying circuit, its gain can be further increased.

Moreover, as a form, it can also be configured that the first amplifying circuit further includes a sixth transistor having a gate and a source connected in common with those of the fourth transistor respectively respectively, the second amplifying circuit further includes a tenth transistor having a gate and a source connected in common with those of the eighth transistor respectively, a drain of the sixth transistor is connected to the drain of the eighth transistor and a drain of the tenth transistor is connected to the drain of the fourth transistor, a ratio between a total of gate widths converted per unit gate length of the fourth and the tenth transistor and a gate width converted per unit gate length of the fifth transistor is nearly proportional to a current ratio between the first current source circuit and the second current source circuit, the gate width converted per unit gate length of the fourth transistor being equal to or more than the gate width converted per unit gate length of the tenth transistor, and a ratio between a total of gate widths converted per unit gate length of the eighth and the sixth transistor and a gate width converted per unit gate length of the ninth transistor is nearly proportional to a current ratio between the third current source circuit and the fourth current source circuit, the gate width converted per unit gate length of the eighth transistor being equal to or more than the gate width converted per unit gate length of the sixth transistor.

This configuration can raise the parallel output resistance of the fourth and tenth transistors and the parallel output resistance of the eighth and sixth transistors, which can increase the gains of the first and second amplifying circuits. Accordingly, as the differential amplifying circuit, its DC gain can be increased by an increase in the DC gains of the first and second amplifying circuits.

Further, as a form, is can also be configured that the first sub-amplifying circuit of the first amplifying circuit further includes a twenty-seventh transistor having a gate and a source connected in common with those of the seventeenth transistor respectively, the second sub-amplifying circuit of the second amplifying circuit further includes a twenty-eighth transistor having a gate and a source connected in common with those of the twenty-first transistor respectively, a drain of the twenty-seventh transistor is connected to a drain of the twenty-first transistor and a drain of the twenty-eighth transistor is connected to a drain of the seventeenth transistor, a gate width converted per unit gate length of the seventeenth transistor is equal to or more than a gate width converted per unit gate length of the twenty-eighth transistor, and a gate width converted per unit gate length of the twenty-first transistor is equal to or more than a gate width converted per unit gate length of the twenty-seventh transistor.

This configuration can raise the parallel output resistance of the seventeenth and twenty-eighth transistors and the parallel output resistance of the twenty-first and twenty-seventh transistors, which can increase the gains of the first and second amplifying circuits. By increasing the gains of the first and second sub-amplifying circuits in this manner, the gains of the first and second amplifying circuits increases, and accordingly as the differential amplifying circuit, its gain can be further increased.

Based on the foregoing, the embodiments will be described below with reference to the drawings. The same numerals and symbols will be used to designate the same or similar components in the drawings. The repeated description thereof will be omitted. Regarding a transistor TN (N is a numeric character or an alphabetic character), the voltage-current conversion ratio (hereinafter expressed as transconductance) will be described as gmN, and the output resistance will be described as roN.

First Embodiment

In a differential amplifying circuit 100 shown in FIG. 1, a signal voltage IN+ inputted from a differential input terminal 1 is voltage-to-current converted in an input stage 20 and outputted from a differential output node 3. The outputted current is inputted to a source of an NMOS transistor T1 and outputted from a drain thereof. The current outputted from the drain of the NMOS transistor T1 is inputted to an output stage 30 from a negative-side current output node 5 and converted to voltage. An output signal OUT- amplified through this process is outputted from a differential output terminal 7.

Similarly, a signal voltage IN- inputted from a differential input terminal 2 is voltage-to-current converted in the input stage 20 and outputted from a differential output node 4. The outputted current is inputted to a source of an NMOS transistor T2 and outputted from a drain thereof. The current outputted from the drain of the NMOS transistor T2 is inputted to the output stage 30 from a positive-side current output node 6 and converted to voltage. An output signal OUT+ amplified through this process is outputted from a differential output terminal 8.

A gain boost amplifying circuit G1 (first amplifying circuit) is connected to the NMOS transistor T1. An input terminal 11 of the gain boost amplifying circuit G1 is connected to the source of the NMOS transistor T1. An output terminal 13 of the gain boost amplifying circuit G1 is connected to a gate of the NMOS transistor T1. Similarly, an input terminal 12 of a gain boost amplifying circuit G2 (second amplifying circuit) is connected to the source of the NMOS transistor T2. An output terminal 14 of the gain boost amplifying circuit G2 is connected to a gate of the NMOS transistor T2. The transistor T1 and the gain boost amplifying circuit G1, and the transistor T2 and the gain boost amplifying circuit G2 constitute intermediate stages, respectively.

Figure 2:
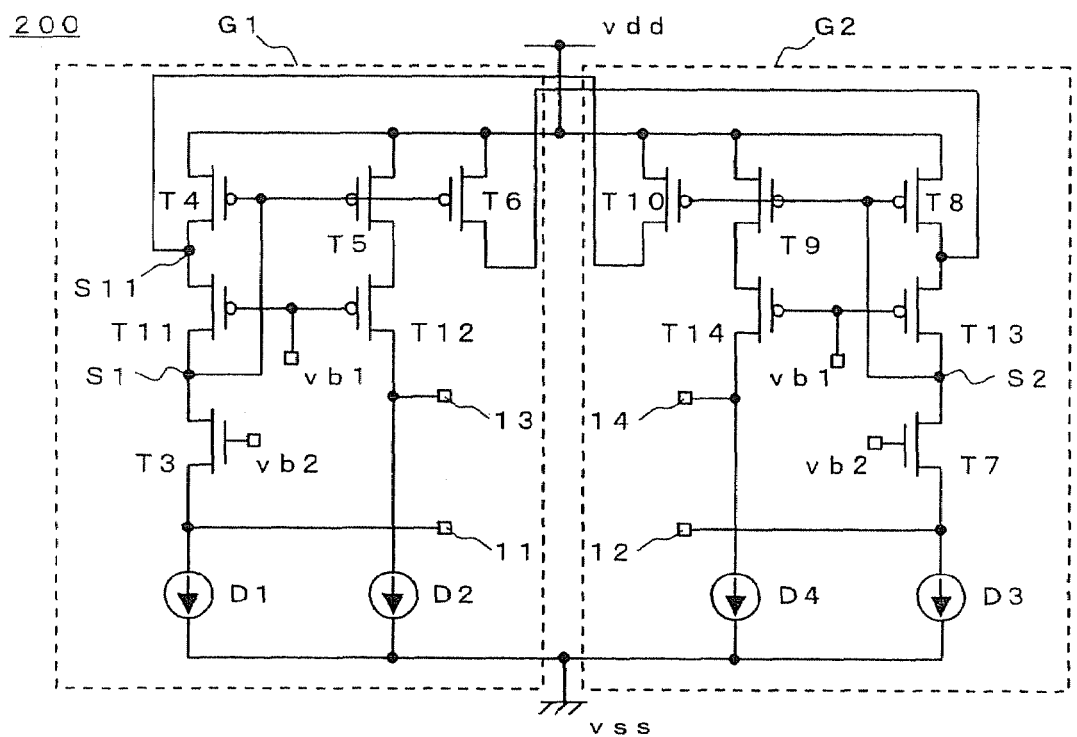
FIG. 2 is a circuit diagram showing one example of gain boost amplifying circuits G1 and G2 shown in FIG. 1.

Referring to FIG. 2, one example of the gain boost amplifying circuits G1 and G2 shown in FIG. 1 is described. As shown in FIG. 2, in a circuit 200 as one example of the gain boost amplifying circuits G1 and G2 shown in FIG. 1, the circuit configuration is the same between the gain boost amplifying circuits G1 and G2 constituting this circuit 200. Current source circuits D1 and D2, an NMOS transistor T3, PMOS transistors T4 to T6, and a connection node S1 of the gain boost amplifying circuit G1 correspond to current source circuits D3 and D4, an NMOS transistor T7, PMOS transistors T8 to T10, and a connection node S2 of the gain boost amplifying circuit G2, respectively.

Given a description of the gain boost amplifying circuit G1 on behalf of them, it includes the current source circuits D1 and D2 whose one ends are connected to a reference potential vss, the transistor T3 having a source to which the differential output node 3 is connected and a gate to which a bias voltage vb2 is applied, a current of the current source circuit D1 being used as a bias current of the transistor T3, the transistor T4 having a source connected to a reference potential vdd, a drain to which a current from the transistor T3 is inputted, and a gate connected to a drain of the transistor T3, the transistor T5 having a gate and a source connected in common with those of the transistor T4 respectively and a drain to which a current from the current source circuit D2 is inputted, and the transistor T6 having a gate and a source connected in common with those of the transistor T4 respectively. The source of the transistor T3 is an input (input terminal 11) of the gain boost amplifying circuit G1, and an output (output terminal 13) of the gain boost amplifying circuit G1 is on the drain side of the transistor T5. A drain of the transistor T6 is connected to a drain of the transistor T8, and a drain of the transistor T10 is connected to the drain of the transistor T4.

To the gain boost amplifying circuits G1 and G2 shown in FIG. 2, PMOS transistors T11 to T14 having gates to which a predetermined bias voltage vb1 is applied and sources to which drains of the PMOS transistor T4, T5, T8, or T9 are connected respectively are further added, respectively. Given a description of the gain boost amplifying circuit G1 on behalf of them, it further includes the transistor T11 having a source connected to the drain of the transistor T4 and a gate to which the bias voltage vb1 is applied, the current of the current source circuit D1 being used as a bias current of the transistor T11, and the transistor T12 having a source connected to the drain of the transistor T5 and a gate to which the bias voltage vb1 is applied, the current of the current source circuit D2 being used as the bias current of the transistor T12. The output (output terminal 13) of the gain boost amplifying circuit G1 is at a drain of the transistor T12.

Hereinafter, the DC gain (DC voltage gain, hereinafter same as this) of the gain boost amplifying circuit G1 will be estimated. The DC gain of the gain boost amplifying circuit G1 is given by the product of a DC gain from the input terminal 11 to the connection node S1 and a DC gain from the connection node S1 to the output terminal 13.

First, the DC gain from the input terminal 11 to the connection node s1 is estimated. The DC gain from the input terminal 11 to the connection node S1 is determined by the product of the transconductance of the NMOS transistor T3 and a resistance appearing at the connection node S1. When a current $\Delta I$ is inputted from the input terminal 11, the current flowing through the NMOS transistor T3 also changes by $\Delta I$. Since the bias voltage vb2 is applied to the gate of the NMOS transistor T3, the inputted current change $\Delta I$ and a voltage change $\Delta Vin1$ of the input terminal 11 change so as to satisfy the following equation.

$$\Delta I = gm3 * \Delta Vin1 \tag{1}$$

The resistance appearing at the connection node S1 is estimated. If the output impedance of the current source circuit D1 is sufficiently large, the resistance appearing at the connection node S1 is determined by the PMOS transistors T4, T10, and T11 connected between the connection node S1 and the reference potential vdd. As shown in FIG. 2, the respective drains of the PMOS transistors T4 and T10 having sources connected to the reference potential vdd and the source of the PMOS transistor T11 having the gate to which the predetermined bias voltage vb1 is applied are connected at a connection node S11, and the PMOS transistors T4, T10, and T11 constitute a cascode circuit.

Figure 3:
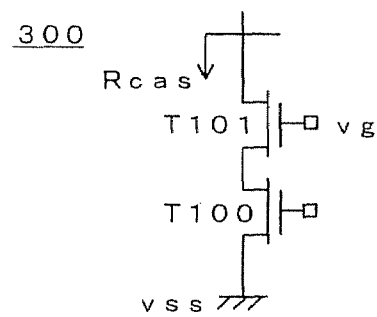
FIG. 3 is a circuit diagram showing a general cascode circuit.

Referring to FIG. 3, a general cascode circuit is described. In FIG. 3, a drain of an NMOS transistor T100 having a source connected to the reference potential vss and a source of an NMOS transistor T101 having a gate to which a predetermined bias voltage vg is applied are connected. As is well known, a resistance Rcas of a circuit 300 appearing from a drain of the NMOS transistor T101 to the reference potential vss is roughly estimated by the product of the transconductance of the NMOS transistor T101, the output resistance thereof, and the output resistance of the NMOS transistor T100. Namely, it is derived as follows.

$$Rcas = gm101 * ro101 * ro100 \tag{2}$$

Returning to FIG. 2, now the voltage change of the connection node S11 to which the respective drains of the PMOS transistors T4 and T10 are connected is taken as $\Delta Vs11$. Since the total of changes in currents flowing through the PMOS transistors T4 and T10 is $\Delta I$, the resistance appearing between the connection node S11 and the reference potential vdd can be written as $\Delta Vs11/\Delta I$. At this time, from (2), a resistance Rs1 at the connection node S1 is given as follows.

$$Rs1 = gm11 * ro11 * (\Delta Vs11/\Delta I) \tag{3}$$

Now, the resistance $\Delta Vs11/\Delta I$ appearing between the connection node S11 and the reference potential vdd is estimated.

$$\Delta I = \Delta I1 + \Delta I2 \tag{4}$$

where $\Delta I1$ and $\Delta I2$ are current changes of the PMOS transistors T4 and T10, respectively. It is assumed here that output resistances ro4 and ro10 of the PMOS transistors T4 and T10 are sufficiently large. At this time, the gate of the PMOS transistor T4 is connected to the connection node S1, whereby the voltage change of the transistor T4 is $\Delta Vs1$ and satisfies the following equation.

$$\Delta I1 = gm4 * \Delta Vs1 \tag{5}$$

On the other hand, the gate of the PMOS transistor T10 is connected to the connection node S2. Since the above operation is performed as the operation of the differential amplifying circuit 100, when the voltage of the connection node S1 of the gain boost amplifying circuit G1 changes by $\Delta Vs1$, the voltage change of the connection node S2 of the corresponding gain boost amplifying circuit G2 becomes $-\Delta Vs1$. Consequently, the following equation is satisfied.

$$\Delta I2 = gm10 * (-\Delta Vs1) \tag{6}$$

The following equation is obtained from (4) to (6).

$$\Delta I = (gm4 - gm10) * \Delta Vs1 \tag{7}$$

Now, if gate widths converted per unit gate length of the PMOS transistors T4 and T10 are equal, bias voltages at the connection nodes S1 and S2 are equal, so that gm4=gm10 holds. Consequently, $\Delta Vs11/\Delta I = \infty$ is derived from (7), and the parallel output resistance of the PMOS transistors T4 and T10 becomes infinite. However, actually, the output resistances of the PMOS transistors T4 and T10 are finite, which gives the following equation:

$$\Delta Vs11/\Delta I = ro4 | |ro10 \tag{8}$$

and the resistance $\Delta Vs11/\Delta I$ appearing between the connection node S11 and the reference potential vdd becomes the parallel resistance of the respective output resistances of the PMOS transistors T4 and T10.

Incidentally, in order that the gain boost amplifying circuit G1 functions as an inverting amplifying circuit, the sign of a resistance ΔVs1/ΔI appearing between the connection node S1 and the reference potential vdd needs to be positive. From (7), the sign of the resistance ΔVs1/ΔI appearing between the connection node S1 and the reference potential vdd depends on a difference gm4−gm10 between the transconductance of the transistor T4 and the transconductance of the transistor T10. Generally, the transconductance of a transistor is proportional to the square root of a gate width per unit gate length, so that the gate width converted per unit gate length of the transistor T4 needs to be equal to or more than the gate width converted per unit gate length of the transistor T10. Moreover, in order to make drain voltages of the transistors T4, T5, and T10 nearly equal, it is desirable that the ratio between the total of gate widths converted per unit gate length of the transistors T4 and T10 and a gate width converted per unit length of the transistor T5 be nearly equal to the ratio between the magnitude of the current of the current source circuit D1 and the magnitude of the current of the current source circuit D2.

From (1), (3), and (8), a voltage gain ΔVs1/ΔVin from the input terminal 11 to the connection node S1 is derived as follows:

$$\Delta Vs1/\Delta Vin = gm3 * Rs1 \tag{9}$$

$$= gm3 * gm11 * ro11 * (ro4 \| ro10)$$

and estimated by the product of the square of the transconductance and the square of the output resistance of the transistor.

Next, the DC gain between the connection node S1 and the output terminal 13 is estimated. The DC gain from the connection node S1 to the output terminal 13 is determined by the product of the transconductance of the PMOS transistor T5 and a resistance appearing at the output terminal 13. The resistance appearing at the output terminal 13 is determined by the PMOS transistors T5 and T12 if the output resistance of the current source circuit D2 is sufficiently large. Since the drain of the PMOS transistor T5 having the source to which the reference potential vdd is connected and the source of the PMOS transistor T12 having the gate to which the predetermined bias voltage vb1 is applied are connected, the PMOS transistors T5 and T12 constitute a cascode circuit. Consequently, a resistance R13 appearing at the output terminal 13 is derived from (2) as follows:

$$R13 = gm12 * ro12 * ro5 \tag{10}$$

Accordingly, from (10), a DC gain ΔVout1/ΔVs1 from the connection node S1 to the output terminal 13 is obtained as follows:

$$\Delta Vout1/\Delta Vs1 = gm5 * R13 \tag{11}$$

$$= gm5 * gm12 * ro12 * ro5$$

and estimated by the product of the square of the transconductance and the square of the output resistance of a transistor.

From the above, a DC voltage gain ΔVout1/ΔVin1 of the gain boost amplifying circuit G1 is the product of (9) and (11) and expressed as follows:

$$\Delta Vout1/\Delta Vin1 = \Delta Vout1/\Delta Vs1 * \Delta Vs1/\Delta Vin1 \tag{12}$$

$$= gm5 * gm12 * ro12 * ro5 * gm3 * gm11 *$$

$$ro11 * (ro4 \| ro10)$$

and roughly estimated by the product of the fourth power of the transconductance and the fourth power of the output resistance of a transistor.

Figure 4:
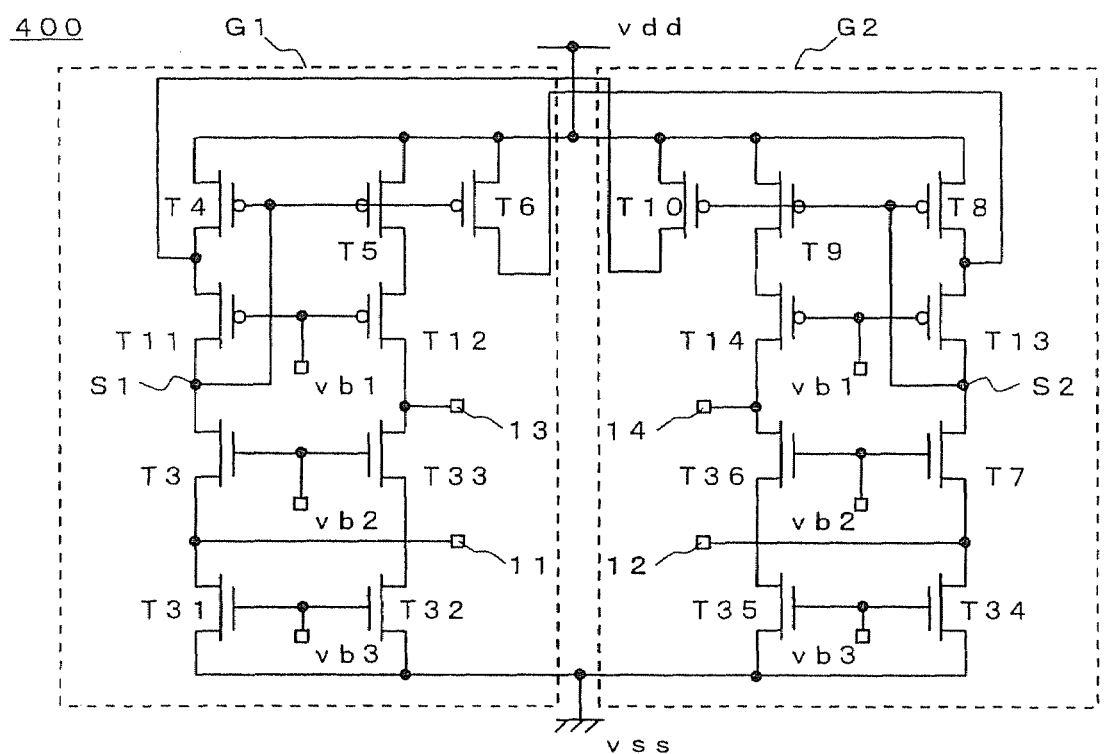
FIG. 4 is a circuit diagram showing another example of the gain boost amplifying circuits G1 and G2 shown in FIG. 1.

Referring to FIG. 4, another example of the gain boost amplifying circuits G1 and G2 shown in FIG. 1 is described. In this circuit 400, the current source circuits D1 to D4 are configured as specific circuits. In the gain boost amplifying circuit G1, NMOS transistors T31 and T32 correspond to the current source circuits D1 and D2 respectively, their sources being connected to the reference potential vss, a predetermined voltage vb3 being applied to their gates, and a constant current I being outputted from their drains. An NMOS transistor T33 has a source connected to the drain of the NMOS transistor T32, a gate to which the predetermined bias voltage vb2 is applied, and a drain to which the output terminal 13 is connected. NMOS transistors T34 to T36 of the gain boost amplifying circuit G2 correspond to the NMOS transistors T31 to T33 of the gain boost amplifying circuit G1, respectively, and the NMOS transistors T34 and T35 correspond to the current source circuits D3 and D4, respectively.

Resistances appearing at the connection node S1 and the output terminal 13, respectively, in FIG. 4 are estimated. A resistance Rs1_4 appearing at the connection node S1 is determined by the parallel resistance of a resistance Rs1_4(vdd) appearing between the connection node S1 and the reference potential vdd and a resistance Rs1_4(vss) appearing between the connection node S1 and the reference potential vss. The resistance Rs1_4(vdd) appearing between the connection node S1 and the reference potential vdd is equal to Rs1 in (3). Since the source of the MOS transistor T3 having the gate to which the bias voltage vb2 is applied and the drain of the NMOS transistor T31 having the source connected to the reference potential vss are connected, the resistance Rs1_4(vss) appearing between the connection node S1 and the reference potential vss is derived from (2) as follows.

$$Rs1\_4(vss) = gm3 * ro3 * ro31 \tag{13}$$

From (3), (8), and (13), the resistance Rs1_4 appearing at the connection node S1 is obtained as follows.

$$Rs1\_4 = Rs1\_4(vdd) \| Rs1\_4(vss) \tag{14}$$

$$= \{gm11 * ro11 * (ro4 \| ro10) \| gm3 * ro3 * ro31\}$$

From (14), the resistance appearing at the connection node S1 is roughly estimated by the product of the transconductance and the square of the output resistance of a transistor, also in the circuit in FIG. 4.

The resistance appearing at the output terminal 13 is estimated. A resistance R13_4 appearing at the output terminal 13 is determined by the parallel resistance of a resistance R13_4(vdd) appearing between the output terminal 13 and the reference potential vdd and a resistance R13_4(vss) appearing between the output terminal 13 and the reference potential vss. The resistance R13_4(vdd) appearing between the output terminal 13 and the reference potential vdd is equal to R13 in equation (10). Since the source of the MOS transistor T33 having the gate connected to the reference potential vb2 and the drain of the NMOS transistor T32 having the source connected to the reference potential vss are connected, the resistance R13_4(vss) appearing between the output terminal 13 and the reference potential vss is derived from (2) as follows.

$$R13\_4(vss) = gm33*ro33*ro32 \quad (15)$$

From (10) and (15), the resistance R13_4 appearing at the output terminal 13 is obtained as follows.

$$R13\_4 = R13\_4(vdd) \| R13\_4(vss) \quad (16)$$
$$= gm12*ro12*ro5 \| gm33*ro33*ro32$$

From (16), the resistance appearing at the output terminal 13 is roughly estimated by the product of the transconductance and the square of the output resistance of a transistor, also in the circuit in FIG. 4.

From (14) and (16), the DC gain of the gain boost amplifying circuit G1 shown in FIG. 4 is roughly estimated by the product of the fourth power of the transconductance and the fourth power of the output resistance of a transistor, similarly to the gain boost amplifying circuit G1 shown in FIG. 2.

Figure 14:
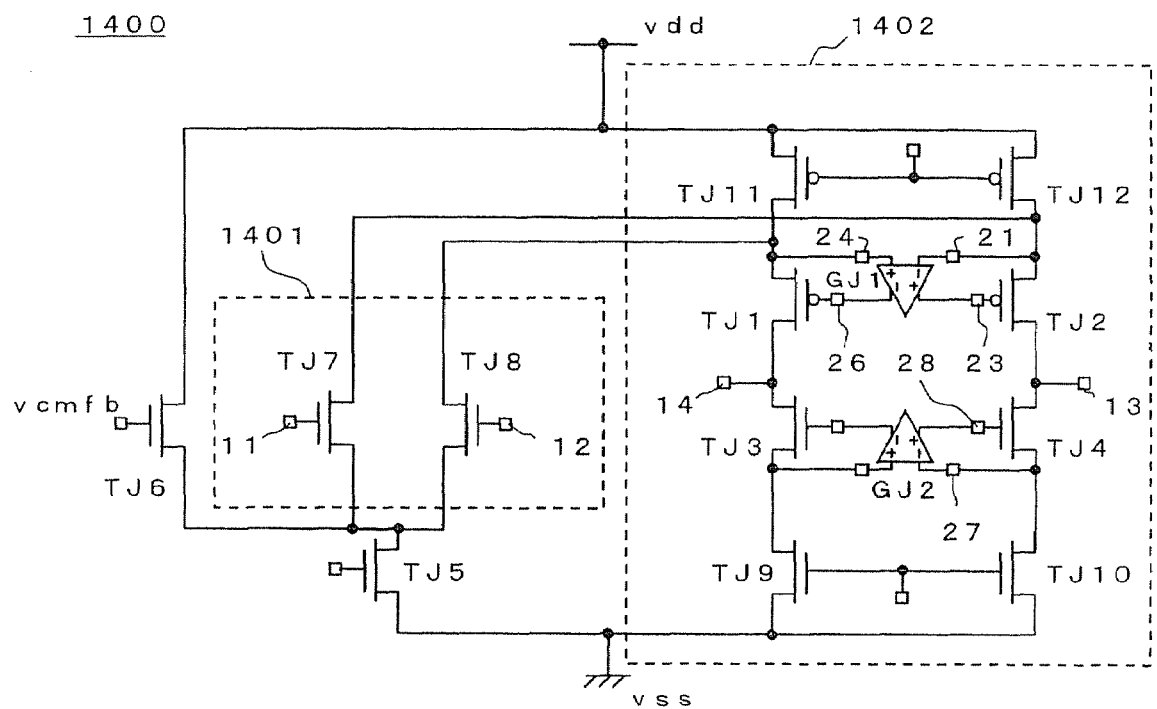
FIG. 14 is a circuit diagram showing a configuration of a differential amplifying circuit as a comparative reference example.

On the other hand, the voltage gain of a differential folded-cascode gain boost amplifying circuit 1400 as a comparative reference example shown in FIG. 14 is estimated. The single-phase DC gain, that is, the voltage gain from the input terminal (negative) 11 to the output terminal (positive) 13 or the voltage gain from the input terminal (positive) 12 to the output terminal (negative) 14 corresponds to the voltage gains of the gain boost amplifying circuits G1 and G2 in FIG. 2.

The voltage gain from the input terminal 11 to the output terminal 13 is estimated. The voltage gain from the input terminal 11 to the output terminal 13 is the product of a transconductance gmJ7 of an NMOS transistor TJ7 of an input stage 1401 and a resistance R13_14 appearing at the output terminal 13. The resistance R13_14 appearing at the output terminal 13 is parallel between a resistance R13_14 (vdd) appearing between the output terminal 13 and the reference potential vdd and a resistance R13_14(vss) appearing between the output terminal 13 and the reference potential vss. The resistance R13_14 (vdd) appearing between the output terminal 13 and the reference potential vdd is determined by PMOS transistors TJ2 and TJ12 and a sub-gain boost amplifying circuit GJ1.

A source of the PMOS transistor TJ12 is connected to the reference potential vdd. The PMOS transistor TJ2 has a source connected to a drain of the PMOS transistor T12 and a drain connected to the output terminal 13. The sub-gain boost amplifying circuit GJ1 has a negative input terminal 21 connected to the source of the PMOS transistor TJ2 and a positive output terminal 23 connected to a gate of the PMOS transistor TJ2. The transistors TJ2 and TJ12 and the sub-gain boost amplifying circuit GJ1 constitute an active cascode circuit.

Figure 5:
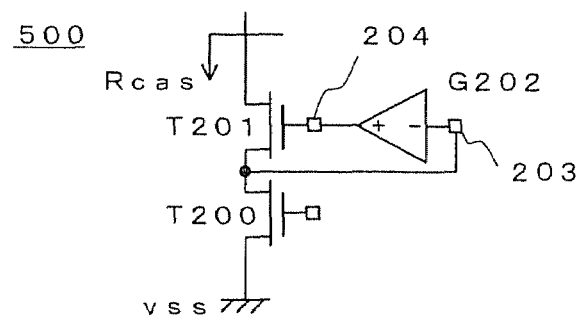
FIG. 5 is a circuit diagram showing a general active cascode circuit.

Referring to FIG. 5, a general active cascode circuit is described. In this circuit 500, an NMOS transistor T200 has a source connected to the reference potential vss. An NMOS transistor T201 has a source connected to a drain of the NMOS transistor T200. An inverting amplifying circuit G202 has a negative input terminal 203 connected to the source of the NMOS transistor T201 and a positive output terminal 204 connected to a gate of the NMOS transistor T201. A resistance Rac_cas of the circuit 500 appearing from a drain of the NMOS transistor T201 to the reference potential Vss is represented by the product of the transconductance of the NMOS transistor T201, the output resistance thereof, the output resistance of the NMOS transistor T200, and a DC gain Ag202 of the inverting amplifying circuit G202, and written as follows.

$$Rac\_cas = Ag202*gm201*ro210*ro200 \quad (17)$$

Returning to FIG. 14, if the single-phase DC gain of the sub-gain boost amplifying circuit GJ1 is taken an Agj1, from equation (17), the resistance R13_14(vdd) appearing between the positive output terminal 13 and the reference potential vdd is written as follows.

$$R13\_14(vdd) = Agj1*gmJ2*roJ12*roJ12 \quad (18)$$

The resistance R13_14 (vss) appearing between the positive output terminal 13 and the reference potential vss is determined by the NMOS transistors TJ4 and TJ10 and a sub-gain boost amplifying circuit GJ2. A source of the NMOS transistor TJ10 is connected to the reference potential vss. The NMOS transistor TJ4 has a source connected to a drain of the NMOS transistor TJ10. The sub-gain boost amplifying circuit GJ2 has a negative input terminal 27 connected to the source of the NMOS transistor TJ4 and a positive output terminal 28 connected to a gate of the NMOS transistor TJ4. The transistors TJ4 and TJ10 and the sub-gain boost amplifying circuit GJ2 constitute an active cascode circuit.

Thus, if the single-phase DC gain of the sub-gain boost amplifying circuit GJ2 is taken an Agj2, from (17), the resistance R13_14 (vss) appearing between the positive output terminal 13 and the reference potential vss is written as follows.

$$R13\_14(vss) = Agj2*gmJ4*roJ4*roJ10 \quad (19)$$

From (18) and (19), the resistance R13_14 appearing at the positive output terminal 13 is obtained as follows.

$$R13\_14 = R13\_14(vdd) \| R13\_14(vss) \quad (20)$$
$$= Agj1*gmJ2*roJ2*roJ12 \| Agj2*$$
$$gmJ4*roJ4*ro10$$

From (20), the voltage gain from the negative input terminal 11 to the positive output terminal 13 is obtained as follows:

$$gmJ7(Agj1*gmJ2*roJ2*roJ12|$$
$$|Ajg2*gmJ4*roJ4*roJ10) \quad (21)$$

and roughly estimated by the product of the square of the transconductance and the square of the output resistance of a transistor and the single-phase DC gain of the sub-gain boost amplifying circuit GJ1 or GJ2.

Figure 15:
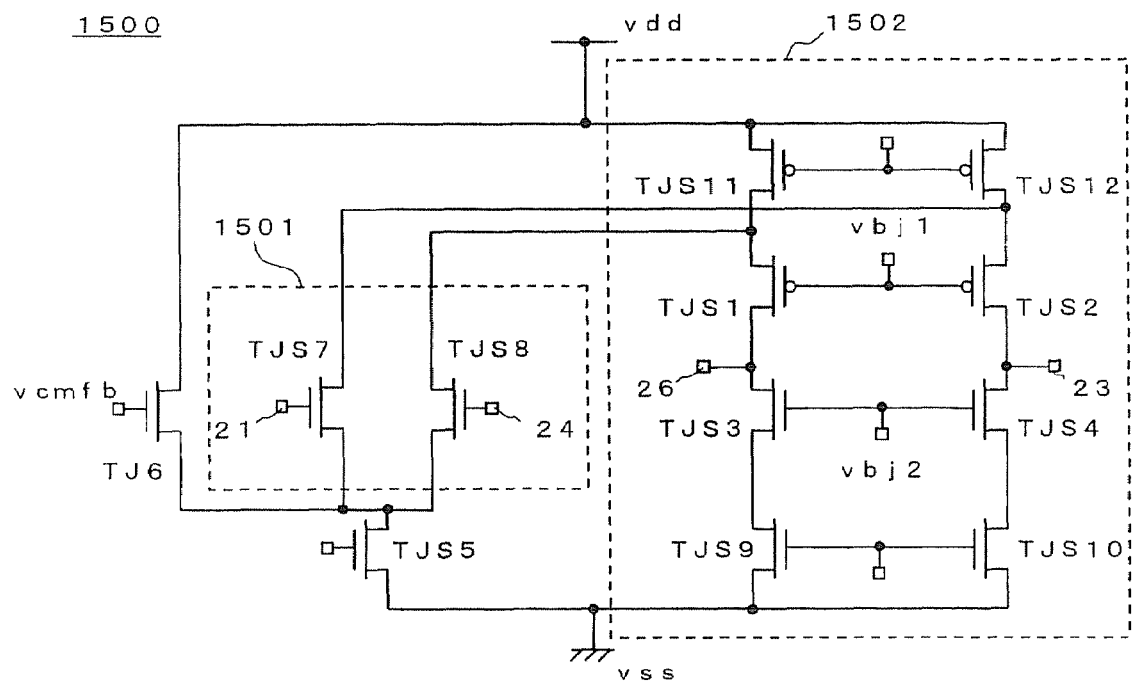
FIG. 15 is a circuit diagram showing one example of gain boost amplifying circuits GJ1 and GJ2 shown in FIG. 14.

The single-phase DC gains Agj1 and Agj2 of the sub-gain boost amplifying circuits GJ1 and GJ2 are estimated. The sub-gain boost amplifying circuits GJ1 and GJ2 can each have a fully differential folded-cascode circuit configuration, their DC gains being equal. Hence, one example, such as shown in FIG. 15, of the gain boost amplifying circuits GJ1 and GJ2 shown in FIG. 14 is described.

The DC gain Agj1 of a fully differential folded-cascode amplifying circuit 1500 is a single-phase voltage gain and, for example, the product of the transconductance of an NMOS transistor TJS7 of an input stage 1501 connected to the negative input terminal 21 and a resistance appearing at an output terminal 23. A resistance R23_15 appearing at the output terminal 23 is parallel between a resistance R23_15 (vdd) appearing between the output terminal 23 and the reference potential vdd and a resistance R23_15 (vss) appearing between the output terminal 13 and the reference potential vss. Bias voltages vbj1 and vbj2 are applied to a gate of a PMOS transistor TJS2 and a gate of an NMOS transistor TJS4, respectively, and a source of a PMOS transistor TJS12 and a source of an NMOS transistor TJS10 are connected to the reference potentials vdd and vss, respectively, and therefore the following equations are derived from (10).

$$R23\_15(vdd) = gmJS2 * roJS2 * roJS12 \quad (22)$$

$$R23\_15(vss) = gmJS4 * roJS4 * roJS10 \quad (23)$$

From (22) and (23), the following equation is obtained.

$$R23 = R23\_15(vdd) \| R23\_15(vss) \quad (24)$$
$$= gmJS2 * roJS2 * roJS12 \| gmJS4 * roJS4 * roJS10$$

From (24), the single-phase DC gain Agj1 of the sub-gain boost amplifying circuit GJ1 is derived as follows:

$$Agj1 = gmjS7 * (gmJS2 * roJS2 * roJS12 | gmJS4 * roJS4 * roJS10) \quad (25)$$

and roughly estimated by the product of the square of the transconductance and the square of the output resistance of a transistor.

From (21) and (25), the voltage gain of the gain boost amplifying circuit G1 shown in FIG. 14 is roughly estimated by the product of the fourth power of the transconductance and the fourth power of the output resistance of a transistor.

From the above, it is known that the gain boost amplifying circuit G1 shown in each of FIG. 2 and FIG. 4 has a DC gain equal to that of the gain boost amplifying circuit 1400 shown in FIG. 14.

Next, power consumption will be compared. The total of currents of the gain boost amplifying circuits G1 and G2 constituting the circuit 200 shown in FIG. 2 is 4I since the current of each of the current source circuits D1 to D4 is I. On the other hand, in the gain boost amplifying circuit 1400 shown in FIG. 14, if the current flowing through each of input transistors TJ7 and TJ8 of the input stage 1401 and transistors TJ9 and TJ10 functioning as power sources of an output stage 1402 is taken as I, the total is 4I, which means that the same power as that of the circuit 200 shown in FIG. 2 is consumed by only these transistors.

Additionally, in the gain boost amplifying circuit 1400 shown in FIG. 14, a transistor TJ6 is inserted between the reference potential vdd and a transistor TJ5 functioning as a current source, and thereby the amount of current which joins at the output stage 1402 via the input stage 1401 from the current source transistor TJ5 is controlled by adjusting a gate voltage vcmfb of the transistor TJ6 so that the output common mode voltage becomes the vicinity of a median value between the reference potentials vdd and vss. The current flowing through this transistor TJ6 is a current which does not directly contribute to the DC gain, and extra power is correspondingly consumed. Moreover, in the gain boost amplifying circuit 1400, the power consumption increases by an amount corresponding to a current required for the sub-gain boost amplifying circuits GJ1 and GJ2.

Also in the circuit 400 shown in FIG. 4, since the current of each of the MOS transistors T31, T32, T34, and T35 is I, their total is 4I, which is also smaller than that in the gain boost amplifying circuit 1400.

From the above, the use of the gain boost amplifying circuit 200 shown in FIG. 2 or the gain boost amplifying circuit 400 shown in FIG. 4 makes it possible to reduce power consumption as well as obtain a DC gain equal to that of the gain boost amplifying circuit 1400 as the comparative reference example. Further, the number of required elements reduces, so that when an integrated circuit is formed, it becomes possible to reduce the chip area and cost.

Second Embodiment

Figure 6:
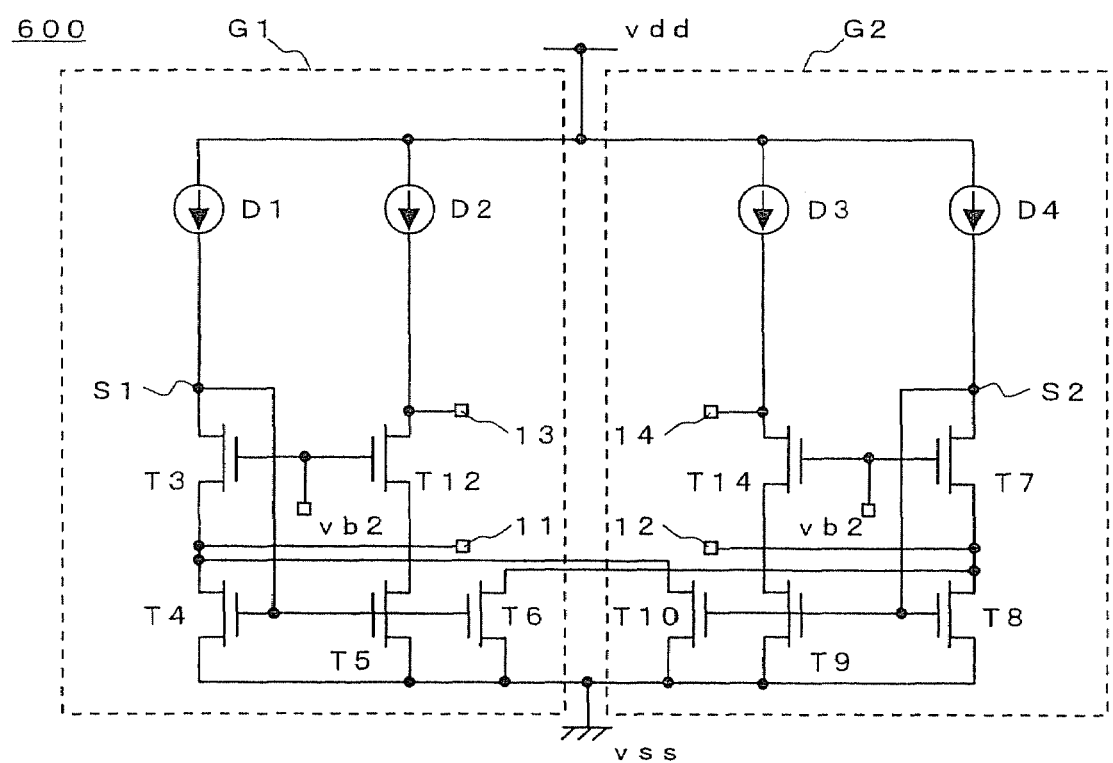
FIG. 6 is a circuit diagram showing still another example of the gain boost amplifying circuits G1 and G2 shown in FIG. 1.

Next, another embodiment will be described with reference to FIG. 6. As shown in FIG. 6, in a circuit 600 as still another example of the gain boost amplifying circuits G1 and G2 shown in FIG. 1, the circuit configuration is the same between the gain boost amplifying circuits G1 (first amplifying circuit) and G2 (second amplifying circuit) constituting this circuit 600. The current source circuits D1 and D2, the NMOS transistors T3 to G6, and the connection node S1 of the gain boost amplifying circuit G1 correspond to the current source circuits D3 and D4, the NMOS transistors T7 to T10, and the connection node S2, respectively.

Moreover, to the gain boost amplifying circuits G1 and G2 shown in FIG. 6, the transistors T12 and T14 having gates to which the bias voltage vb2 is applied and sources respectively connected to drains of the NMOS transistors T5 and T9 are added, respectively. Given a description of the gain boost amplifying circuit G1 on behalf of them, it includes the transistor T12 having the source connected to the drain of the transistor T5 and the gate to which the bias voltage vb2 is applied, the current of the current source circuit D2 being used as a bias current of the transistor T12. The output (output terminal 13) of the gain boost amplifying circuit G1 is at a drain of the transistor T12.

Hereinafter, the DC gain of the gain boost amplifying circuit G1 will be estimated. The DC gain from the output terminal 11 to the connection node S1 is the product of the transconductance of the NMOS transistor T3 and a resistance appearing at the connection node S1. The resistance appearing at the connection node S1 is determined by the NMOS transistors T3, T4, and T10. The predetermined bias voltage vb2 is applied to a gate of the NMOS transistor T3. Sources of the NMOS transistors T4 and T10 are connected to the reference potential vss, and the NMOS transistors T3, T4, and T10 constitute a cascode circuit.

The voltage at the connection node S1 as the gate voltage of the NMOS transistor T4 and the voltage at the connection node S2 as the gate voltage of the NMOS transistor T10 are reverse to each other. Therefore, the DC gain from the input terminal 11 to the connection node S1 is equal to (9) and roughly estimated by the product of the square of the transconductance and the square of the output resistance of a transistor.

The DC gain from the connection node S1 to the output terminal 13 is the product of the transconductance of the NMOS transistor T5 and a resistance appearing at the output terminal 13. The resistance appearing at the output terminal 13 is determined by the NMOS transistors T5 and T12. The predetermined bias voltage vb2 is applied to the gate of the NMOS transistor T12. A source of the NMOS transistor T5 is connected to the reference potential vss, and the NMOS transistors T5 and T12 constitute a cascode circuit. Therefore, the DC gain from the connection node S1 to the output terminal 13 is equal to (11) and roughly estimated by the product of the square of the transconductance and the square of the output resistance of a transistor.

From the above, the DC gain of the gain boost amplifying circuit G1 shown in FIG. 6 is roughly estimated by the product of the fourth power of the transconductance and the fourth power of the output resistance of a transistor, and equal to the DC gain of the gain boost amplifying circuit 1400 shown in FIG. 14.

Moreover, the power consumption of the gain boost amplifying circuit 600 shown in FIG. 6 depends on 4I which is the total of currents flowing through the current source circuits D1 to D4 and smaller than that of the gain boost amplifying circuit 1400 shown in FIG. 14. From the above, the use of the gain boost amplifying circuit 600 of this embodiment makes it possible to reduce power consumption as well as obtain a DC gain equal to that of the gain boost amplifying circuit 1400 shown in FIG. 14. Further, the number of required elements reduces, so that when an integrated circuit is formed, it becomes possible to reduce the chip area and cost.

Third Embodiment

Figure 7:
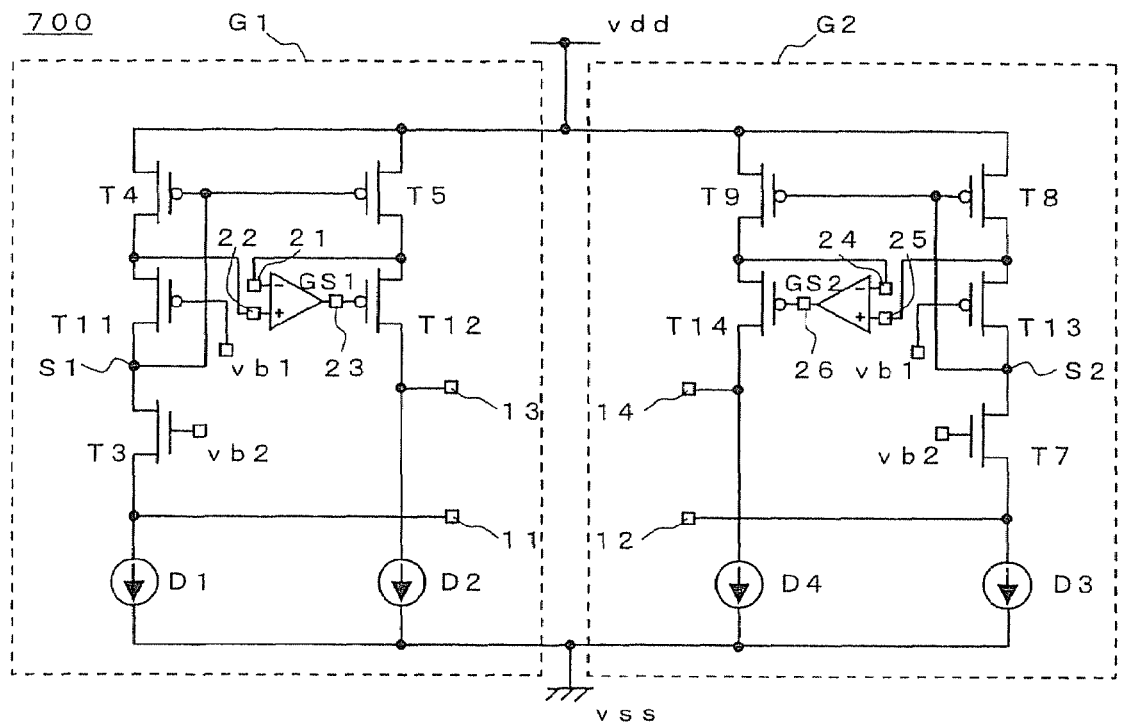
FIG. 7 is a circuit diagram showing yet another example of the gain boost amplifying circuits G1 and G2 shown in FIG. 1.

Next, still another embodiment of the present invention will be described with reference to FIG. 7. As shown in FIG. 7, in a circuit 700 as yet another example of the gain boost amplifying circuits G1 and G2 shown in FIG. 1, the circuit configuration is the same between the gain boost amplifying circuits G1 and G2 constituting this circuit 700. Compared with the circuit 200 shown in FIG. 2, the PMOS transistors T6 and T10 are omitted, and sub-gain boost amplifying circuits GS1 and GS2 are added. Now it is assumed that the sub-gain boost amplifying circuits GS1 and GS2 have the same circuit configuration.

The DC gain of the gain boost amplifying circuit G1 shown in FIG. 7 is estimated. First, the DC gain from the input terminal 11 to the connection node S1 is estimated. When the current ΔI is inputted to the source of the NMOS transistor T3, the current flowing through the NMOS transistor T3 changes by ΔI. At this time, the relation between a transconductance gm3 of the NMOS transistor T3 and a voltage change ΔVin of its source is given by (1). The current change of the PMOS transistor T4 is ΔI.

The gate of the PMOS transistor T4 is connected to the connection node S1. Therefore, if the resistance of the current source circuit D1 is sufficiently large and the transconductance of the PMOS transistor T4 is taken as gm4, a resistance ΔVs1/ΔI appearing at the connection node S1 is written as follows.

$$\Delta Vs1/\Delta I = 1/gm4 \quad (26)$$

From (26), a voltage gain ΔVs1/ΔVin from the input terminal 11 to the connection node S1 is obtained as follows:

$$\Delta Vs1/\Delta Vin = gm3/gm4 \quad (27)$$

and a voltage change ΔVs1 of the connection node S1 is almost the same as the voltage change ΔVin of the output terminal 11.

Next, the voltage gain from the connection node S1 to the output terminal 13 will be estimated. The voltage gain from the connection node S1 to the output terminal 13 is the product of the transconductance of the PMOS transistor T5 and the resistance appearing at the output terminal 13. If the resistance of the power source circuit D2 is sufficiently large, the resistance appearing at the output terminal 13 is determined by the PMOS transistors T5 and T12 and the sub-gain boost amplifying circuit GS1.

The source of the PMOS transistor T5 is connected to the reference potential vdd. The PMOS transistor T12 has the source connected to the drain of the PMOS transistor T5 and the drain connected to the output terminal 13. The sub-gain boost amplifying circuit GS1 has the negative input terminal 21 connected to the source of the PMOS transistor T5 and the positive output terminal 23 connected to the gate of the PMOS transistor T12. The transistors T5 and T12 and the sub-gain boost amplifying circuit GS1 constitute an active cascode circuit. Accordingly, the resistance appearing at the output terminal 13 is equal to (17) and derived as follows:

$$Ags1*gm12*ro12*ro5 \quad (28)$$

where Ags1 is the DC gain of the sub-gain amplifying circuit GS1.

From (28), the voltage gain from the connection node S1 to the output terminal 13 is obtained as follows:

$$gm5*Ags1*gm12*ro12*ro5 \quad (29)$$

and roughly estimated by the product of the square of the transconductance and the square of the output resistance of a transistor and the DC gain of the sub-gain boost amplifying circuit GS1.

Figure 8:
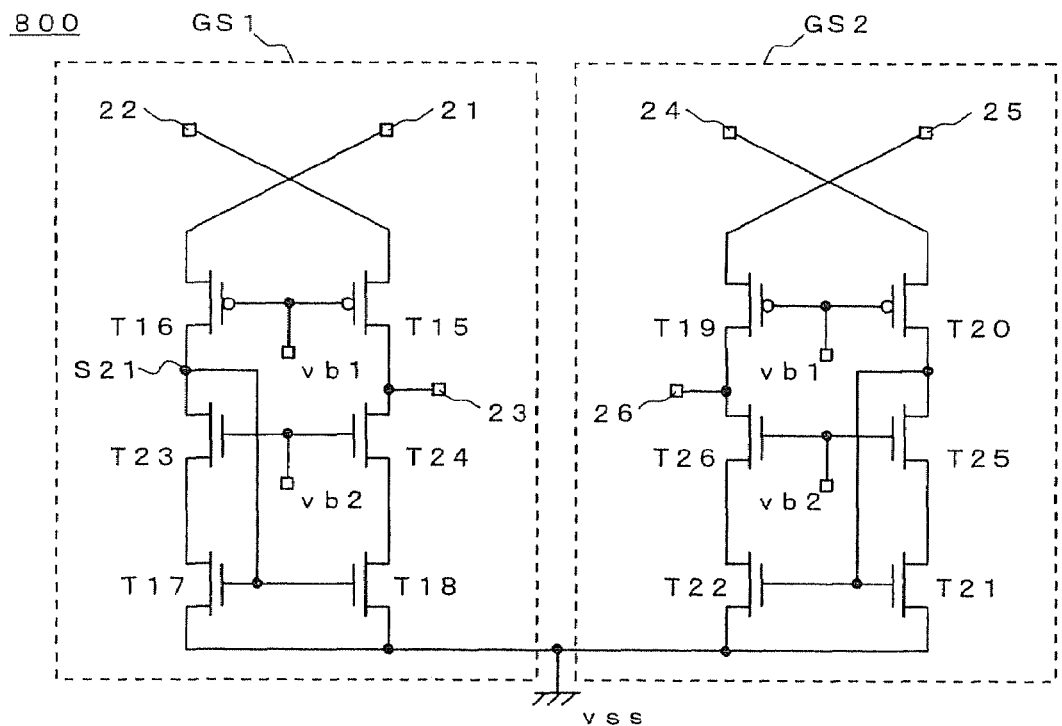
FIG. 8 is a circuit diagram showing one example of sub-gain boost amplifying circuits GS1 and GS2 shown in FIG. 7.

The DC gains of the sub-gain boost amplifying circuits GS1 and GS2 are estimated with reference to FIG. 8. A circuit 800 shown in FIG. 8 is one example of the sub-gain boost amplifying circuits GS1 and GS2 shown in FIG. 7. PMOS transistors T15 and T16 in the sub-gain boost amplifying circuit GS1 constituting the circuit 800 have sources connected to the positive and negative input terminals 22 and 21 respectively and gates to which the predetermined bias voltage vb1 is applied. An NMOS transistor T17 has a source connected to the reference potential vss and a gate connected to a drain of the PMOS transistor T16. An NMOS transistor T18 has a source and a gate connected in common with those of the NMOS transistor T17.

Further, NMOS transistors T23 and T24 having sources connected to drains of the NMOS transistors T17 and T18, gates to which the predetermined bias voltage vb2 is applied, and drains connected to drains of the PMOS transistors T16 and T15, respectively.

The sub-gain boost amplifying circuits GS1 and GS2 have the same circuit configuration, and the PMOS transistors T15 and T16 and the NMOS transistors T17, T18, T23, and T24 of the sub-gain boost amplifying circuit GS1 correspond to PMOS transistors T19 and T20 and NMOS transistors T21, T22, T25, and T26 of the sub-gain boost amplifying circuit GS2, respectively.

The DC gain Ags1 of the sub-gain boost amplifying circuit GS1 shown in FIG. 8 is roughly estimated by the product of a DC gain from the input terminal 21 to a connection node S21 and a DC gain from the connection node S21 to the output terminal 23. The DC gain from the input terminal 21 to the connection node S21 is the product of a transconductance gm16 of the PMOS transistor T16 and a resistance appearing at the connection node 21. A resistance Rs21_8 appearing at the connection node S21 is parallel between a resistance Rs21_8(vdd) appearing between the connection node S21 and the reference potential vdd and a resistance Rs21_8(vss) appearing between the connection node S21 and the reference potential vss. The resistance Rs21_8(vdd) appearing between the connection node S21 and the reference potential vdd is determined by the NMOS transistor T16 and the NMOS transistor T5 connected via the input terminal 21. Since the NMOS transistors T16 and T15 constitute a cascode circuit, the following equation is given.

$$Rs21\_8(vdd) = gm16*ro16*ro5 \quad (30)$$

Since the gate of the NMOS transistor T17 is connected to the connection node S21, the resistance Rs21_8 (vss) appearing between the connection node S21 and the reference potential vss is derived from (26) as follows.

$$Rs21\_8(vss)=1/gm17 \quad (31)$$

Thus, from (30) and (31), a rough estimate is performed as follows.

$$Rs21\_8 = Rs21\_8(vdd) \| Rs21\_8(vss) \quad (32)$$
$$= 1/gm17$$

From (32), the DC gain from the input terminal 21 to the connection node S21 is derived as follows:

$$gm21/gm17 \quad (33)$$

and it is small.

The DC gain from the connection node S21 to the output terminal 23 is represented by the product of the transconductance of the NMOS transistor T18 and a resistance appearing at the output terminal 23. A resistance R23 appearing at the out terminal R23 is parallel between a resistance R23(vdd) appearing between the output terminal 23 and the reference potential vdd and a resistance R23(vss) appearing between the output terminal 23 and the reference potential vss. Since the NMOS transistors T18 and T24 clearly constitute a cascode circuit, the resistance R23(vss) is equal to (2) and written as follows.

$$R23(vss)=gm24*ro24*ro18 \quad (34)$$

Since the PMOS transistor T15 and the PMOS transistor T4 connected thereto via the input terminal 22 also clearly constitute a cascode circuit, R23(vdd) is equal to (2) and written as follows.

$$R23(vdd)=gm15*ro15*ro4 \quad (35)$$

From (34) and (35), R23 appearing at the output terminal 23 is written as follows.

$$R23 = R23(vdd) \| R23(vss) \quad (36)$$
$$= gm24*ro24*ro18 \| gm15*ro15*ro4$$

From (36), the DC gain Ags1 from the connection node S21 to the output terminal 23 is derived as follows:

$$Ags1=gm18*(gm24*ro24*ro18 | gm15*ro15*ro4) \quad (37)$$

and roughly estimated by the product of the square of the transconductance and the square of the output resistance of a transistor.

Figure 17:
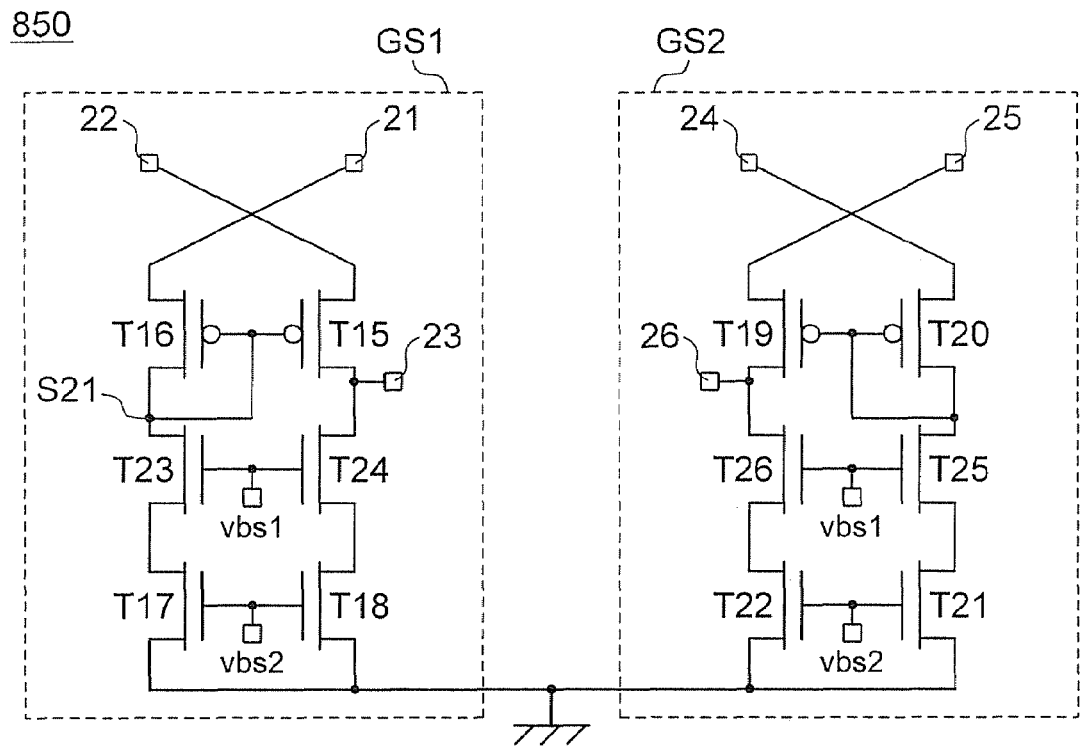
FIG. 17 is a circuit diagram showing another example of sub-gain boost amplifying circuits GS1 and GS2 shown in FIG. 7.

FIG. 17 indicates another example of sub-gain boost amplifying circuits GS1 and GS2 shown in FIG. 7.

As shown in FIG. 17, a circuit 850 as another example of the gain boost amplifying circuits GS1 and GS2 shown in FIG. 7 has the same circuit configuration as the circuit 800 shown in FIG. 8 except that a gate and a drain of PMOS transistor T15 are connected to each other, a gate and a drain of PMOS transistor T17 are connected to each other, and predetermined bias voltage vb2 is applied to gates of NMOS transistors T17, T18, T21, and T22.

The DC gain of the gain boost amplifying circuit GS1 shown in FIG. 17 is given by a product of a DC gain from the input terminal 21 to the connection node S21 and a DC gain from the connection node S21 to the output terminal 23.

NMOS transistors T23 and T17 constitute current sources to provide constant currents to the PMOS transistor T16 for stabilizing voltage between a gate and a source of the PMOS transistor T16. Therefore, the DC gain from the input terminal 21 to the connection node S21 is 1.

Furthermore, the DC gain from the connection node S21 to the output terminal 23 is determined to be the product of the transconductance gm16 of the PMOS transistor T15 and a resistance Rs23 appearing at the connection node S23, as the following equation.

$$gm16*R23 = gm16*(R23(vdd) \| R23(vss)) \quad (38)$$
$$= gm16*(gm24*ro24*ro18 \| gm15*ro15*ro4)$$

As the DC gain from the input terminal 21 to the connection node S21 is 1, the DC gain of the gain boost amplifying circuit GS1 shown in FIG. 17 is estimated to be a product of the square of the transconductance and the square of the output resistance of the transistor. That is, the DC gains of the sub-gain boost amplifying circuits shown in FIG. 17 is equal to the DC gains of the sub-gain boost amplifying circuits shown in FIG. 8. From (37), the DC gain Ags1 of the sub-gain boost amplifying circuit GS1 shown in FIG. 8 is roughly estimated to be the product of the square of the transconductance and the square of the output resistance of a transistor.

From (29) and (37), the gain boost amplifying circuit G1 shown in FIG. 7 has a DC gain which is roughly estimated by the product of the fourth power of the transconductance and the fourth power of the output resistance of a transistor and equal to that of the gain boost amplifying circuit 1400 as the comparative reference example. Moreover, speaking of power consumption, it is reduced at least by an amount corresponding to a current flowing through the transistor TJ6 of the gain boost amplifying circuit 1400. The amount of currents required in the sub-gain boost amplifying circuits GS1 and GS2 are, for example, equal to the amount of a current required in the sub-gain boost amplifying circuit GJ1 in the gain boost amplifying circuit 1400.

Figure 9:
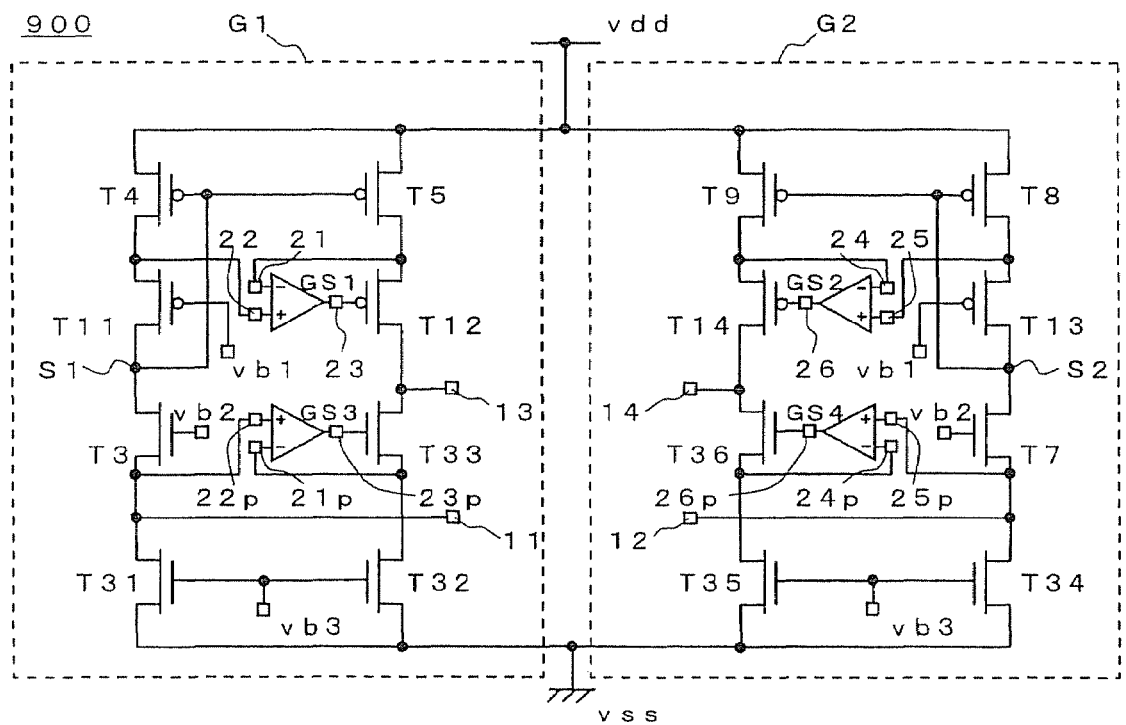
FIG. 9 is a circuit diagram showing yet another example of the gain boost amplifying circuits G1 and G2 shown in FIG. 1.

Referring to FIG. 9, yet another example of the gain boost amplifying circuits G1 and G2 shown in FIG. 1 is described. In this circuit 900, the current source circuits D1 to D4 are configured as specific circuits. A resistance Rs1_9 appearing at the connection node S1 is estimated. A resistance Rs1_9 (vdd) appearing between the connection node S1 and the reference potential vdd is represented by (26). On the other hand, since the NMOS transistors T3 and T31 constitute a cascode circuit, a resistance Rs1_9(vss) appearing between the connection node S1 and the reference potential vss is equal to (2) and sufficiently larger compared with Rs1_9 (vdd). Therefore, the resistance Rs1_9 appearing at the connection node S1 can approximate as follows:

$$Rs1\_9=Rs1\_9(vdd) | Rs1\_9(vss)=Rs1\_9(vdd)=1/gm4 \quad (39)$$

and it is equal to the resistance appearing at the connection node S1 in the circuit shown in FIG. 7.

A resistance R13_9 appearing at the output terminal 13 is estimated. Since the PMOS resistors T5 and T12 and the sub-gain boost amplifying circuit GS1 constitute an active cascode circuit, a resistance R13_9(vdd) appearing between the output terminal 13 and the reference potential vdd is equal to (17). Since the NMOS transistors T32 and T33 and the sub-gain boost amplifying circuit GS3 also constitute an active cascode circuit, a resistance R13_9(vss) appearing between the output terminal 13 and the reference potential vdd is also equal to (17).

Figure 10:
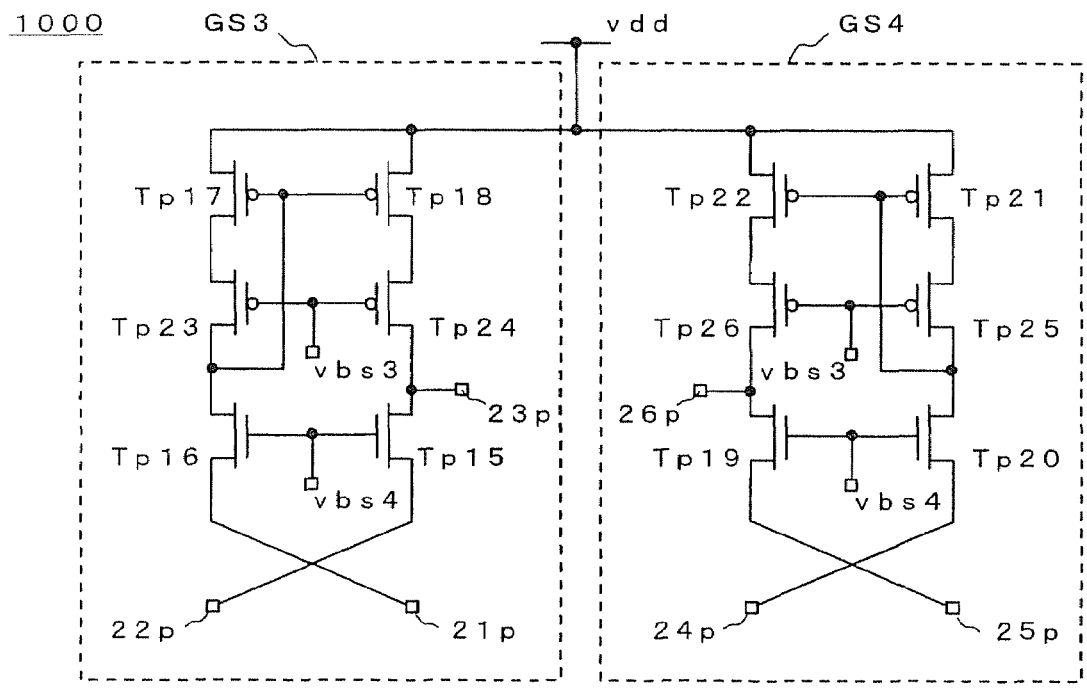
FIG. 10 is a circuit diagram showing one example of sub-gain boost amplifying circuits GS3 and GS4 shown in FIG. 9.

Referring to FIG. 10, one example of sub-gain boost amplifying circuits GS3 and GS4 shown in FIG. 9 is described. The sub-gain boost amplifying circuits GS3 and GS4 constituting this circuit 1000 have the same circuit configuration as the sub-gain boost amplifying circuits GS1 and GS2 in FIG. 8 except for the difference between PMOS and NMOS, and transistors T15 to T26 and terminals 21 to 26 correspond to transistors Tp15 to Tp26 and terminals 21p to 26p, respectively. The DC gains of the sub-gain boost amplifying circuits GS3 and GS4 shown in FIG. 10 are the same as the DC gain of the sub-gain boost amplifying circuit GS1 since they have the same circuit configuration. If the DC gain of the sub-gain boost amplifying circuit GS3 is taken as Ags3, the resistance R13_9 appearing at the output terminal 13 is derived as follows:

$$R13\_9 = R13\_9(vdd) \| R13\_9(vss) \quad (40)$$
$$= Ags1 * gum12 * ro12 * ro5 \| Ags3 *$$
$$gm33 * ro33 * ro32$$

and equal to the resistance R13 of the circuit 700 represented by (28). Hence, the DC gain of the gain boost amplifying circuit GS1 shown in FIG. 9 also becomes equal to the DC gain of the gain boost amplifying circuit 1400 as the comparative reference example.

Figure 18:
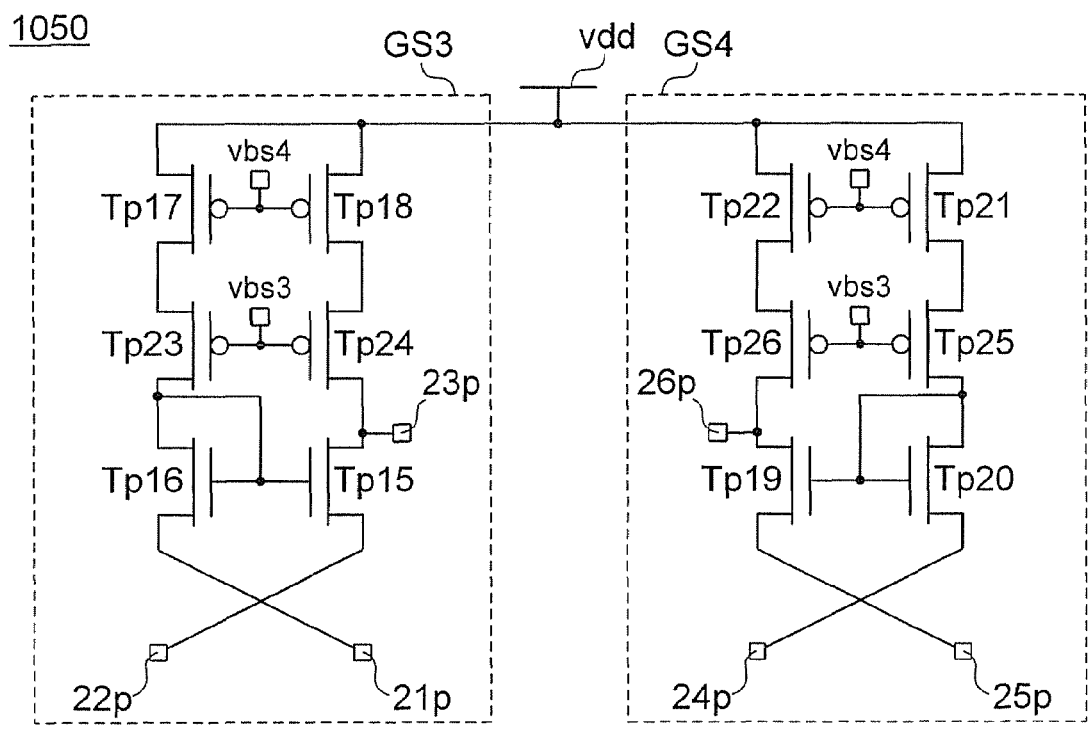
FIG. 18 is a circuit diagram showing another example of sub-gain boost amplifying circuits GS3 and GS4 shown in FIG. 9.

FIG. 18 indicates another example of sub-gain boost amplifying circuits GS3 and GS4 shown in FIG. 9.

As shown in FIG. 18, a circuit 1050 as another example of the gain boost amplifying circuits GS3 and GS4 shown in FIG. 9 has the same circuit configuration as the circuit 850 shown in FIG. 17 except that a difference between PMOS and NMOS exists. Transistors T15 to T26 correspond to transistors Tp15 to Tp26, respectively. Terminals 21 to 26 correspond to terminals 21p to 26p, respectively.

Therefore, the DC gains of the gain boost amplifying circuits GS3 and GS4 shown in FIG. 18 is equal to the DC gains of the gain boost amplifying circuits GS1 and GS2, respectively.

The power consumption of the gain boost amplifying circuit shown in FIG. 9 is estimated. If the current in each of NMOS transistors T31, T32, T34, and T35 functioning as current sources is taken as I and the current flowing through each of the NMOS transistors T17, T18, T21, and T22 of the sub-gain boost amplifying circuits GS1 and GS2 shown in FIG. 8 and the NMOS transistors Tp17, Tp18, Tp21, and Tp22 of the sub-gain boost amplifying circuits GS3 and GS4 shown in FIG. 10 is taken as Is, the total of currents flowing through the gain-boost amplifying circuit 900 is derived as follows.

4I+8Is

On the other hand, the power consumption of the sub-gain boost amplifying circuits GJ1 and GJ2 used in the gain boost amplifying circuit 1400 is estimated. If the current flowing through each of transistors TJS7 and TJS8 of the input stage 1501 and power source transistors TJS9 and TJS10 of an output stage of the differential amplifying circuit 1500 as a circuit diagram of the sub-gain boost amplifying circuit GJ1 is taken as Is, the current flowing through one circuit 1500 is 4Is, and the total of currents flowing through two circuits becomes 8Is. Accordingly, the total of currents flowing through the gain-boost amplifying circuit 1400 is derived as follows.

4I+8Is+(consumption current flowing through transistor TJ6)

Namely, in the gain boost amplifying circuit 1400, extra power corresponding to the current flowing through the transistor TJ6 to adjust the output common mode voltage is consumed. Therefore, the power consumption of the gain boost amplifying circuits G1 and G2 used in this embodiment is lower than that of the gain boost amplifying circuit 1400. From the above, the use of the gain boost amplifying circuits G1 and G2 used in this embodiment makes it possible to reduce power consumption as well as obtain a DC gain equal to that of the gain boost amplifying circuit 1400.

Fourth Embodiment

Figure 11:
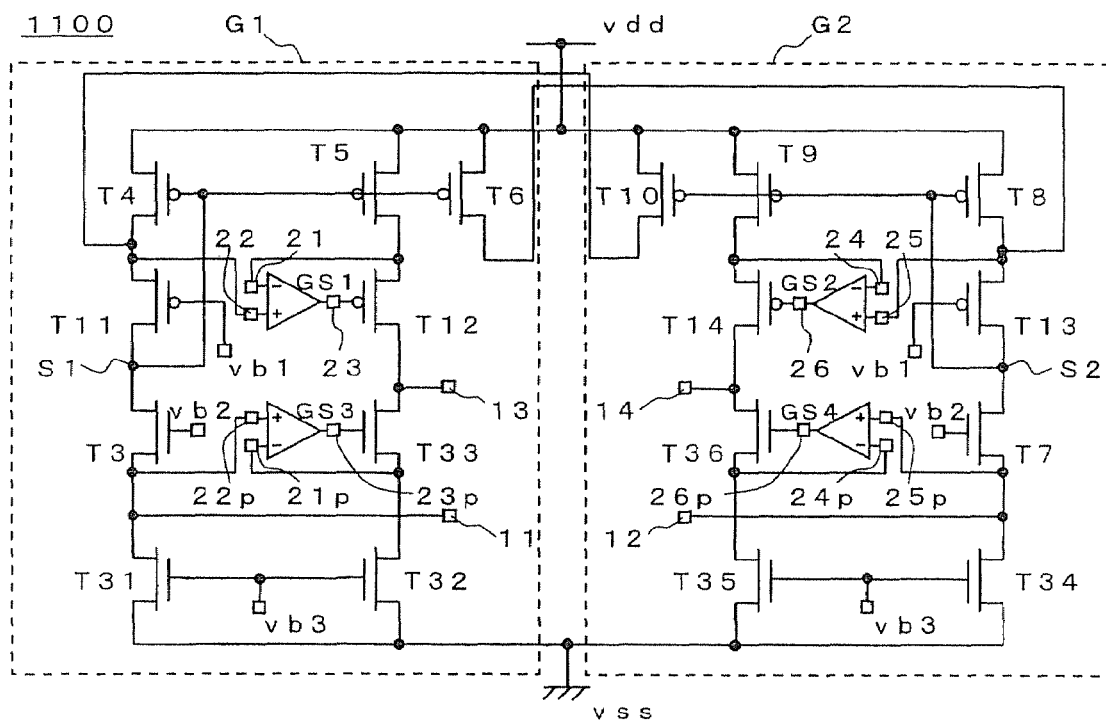
FIG. 11 is a circuit diagram showing yet another example of the gain boost amplifying circuits G1 and G2 shown in FIG. 1.

Next, yet another embodiment of the present invention will be described with reference to FIG. 11. As shown in FIG. 11, a circuit 1100 as yet another example of the gain boost amplifying circuits G1 and G2 shown in FIG. 1 has the same circuit configuration as the circuit 900 shown in FIG. 9 except that the PMOS transistors T6 and T10 are added. Connections of the PMOS transistors T6 and T10 are the same as in the case of the circuit 400 shown in FIG. 4.

The DC gain of the gain boost amplifying circuit G1 shown in FIG. 11 is estimated. A resistance appearing at the connection node S1 is given by (14) since connections of the NMOS transistors T3 and T31 and the PMOS transistors T4, T10, and T11 are equal to those shown in FIG. 4. Thus, the DC gain from the input terminal 11 to the connection node S1 becomes the product of the square of the transconductance and the square of the output resistance of a transistor.

Moreover, connections between the NMOS transistors T32 and T33, the PMOS transistors T5 and T12, and the sub-gain boost amplifying circuits GS1 and GS3 are equal to those shown in FIG. 9, so that the DC gain from the connection node S1 to the output terminal 13 becomes the product of the fourth power of the transconductance and the fourth power of the output resistance of a transistor. Consequently, the DC gain of the gain boost amplifying circuit G1 is roughly estimated by the product of the sixth power of the transconductance and the sixth power of the output resistance of a transistor and becomes larger than that of the gain boost amplifying circuit 1400 as the comparative reference example.

Further, since there is no current increase due to addition of the PMOS transistors T6 and T10 as estimated in the circuit 400, the total consumption current of the circuit 1100 is smaller by the current flowing through the transistor TJ6 of the gain boost amplifying circuit 1400, resulting in lower power consumption. From the above, the use of the gain boost amplifying circuits G1 and G2 used in this embodiment makes it possible to reduce power consumption as well as obtain a DC gain larger than that of the gain boost amplifying circuit 1400.

Fifth Embodiment

Next, yet another embodiment of the present invention will be described with reference to FIG. 12 and FIG. 13.

In a circuit 1200 (FIG. 12) as one example of the sub-gain boost amplifying circuits GS1 and GS2 shown in FIG. 11, NMOS transistors T27 and T28 are added to the sub-gain boost amplifying circuits GS1 and GS2 shown in FIG. 8, respectively. The NMOS transistor T27 has a source and a gate connected in common with those of the NMOS transistor T17 and a drain connected to a drain of the NMOS transistor T21. The NMOS transistor T28 has a source and a gate connected in common with those of the NMOS transistor T21 and a drain connected to a drain of the NMOS transistor T17.

Figure 12:
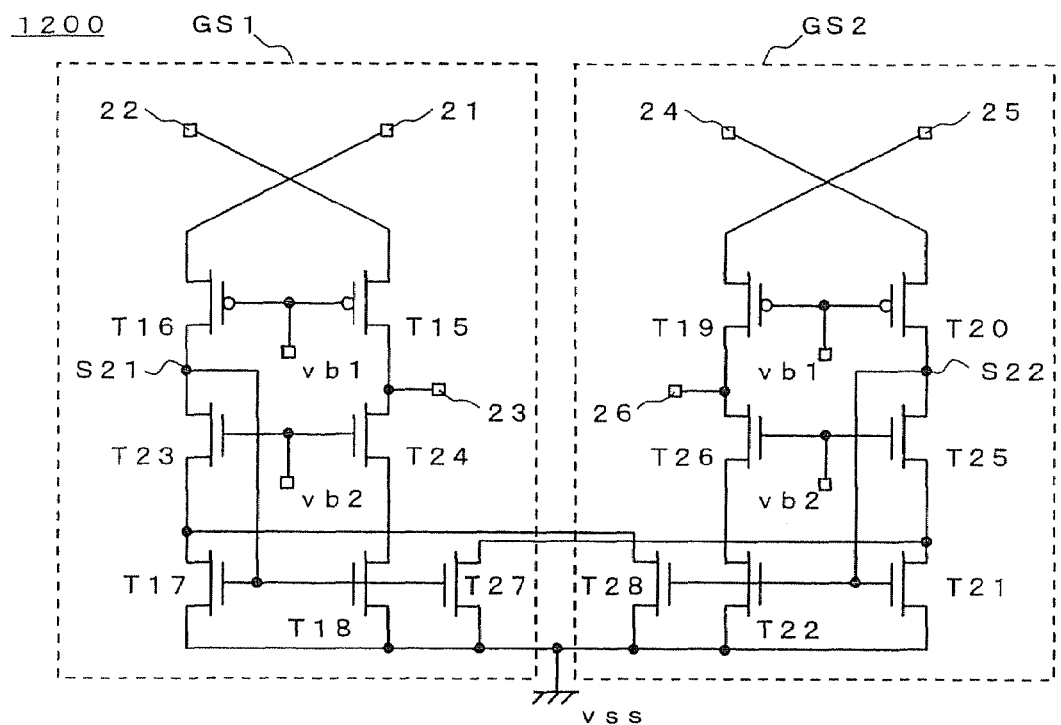
FIG. 12 is a circuit diagram showing one example of sub-gain boost amplifying circuits GS1 and GS2 shown in FIG. 11.

The DC gain of the sub-gain boost amplifying circuit GS1 shown in FIG. 12 is estimated. The DC gain from the input terminal 21 to the connection node S21 is the product of the transconductance of the PMOS transistor T16 and a resistance appearing at the connection node S21. A resistance R21_12 (vdd) appearing between the connection node S21 and the reference potential vdd is equal to Rs21_8(vdd) in (30). A resistance R21_12 (vss) appearing between the connection node S21 and the reference potential vss is determined by the NMOS transistors T17, T23, and T28.

Voltage changes of the connection node S21 of the sub-gain boost amplifying circuit GS1 and the connection node S22 of the sub-gain boost amplifying circuit GS2 are reverse because of operations as the gain boost amplifying circuits G1 and G2. Moreover, since the gate of the NMOS transistor 17 is connected to the connection node S21, and the gate of the NMOS transistor T28 is connected to the connection node S22, the connection relation between the NMOS transistors T17 and T28 is equal to the connection relation between the PMOS transistors T4 and T6 in the gain boost amplifying circuits GS1 and GS2 shown in FIG. 2.

Consequently, the resistance R21_12(vss) appearing between the connection node S21 and the reference potential vss is equal to (9). From this, a resistance R21_12 appearing at the connection node S21 is equal to (14), and the DC gain from the input terminal 21 to the connection node S21 is roughly estimated by the product of the square of the transconductance and the square of the output resistance of a transistor.

The DC gain from the connection node S21 to the output terminal 23 is the product of the transconductance of the PMOS transistor T18 and a resistance R23_12 appearing at the output terminal 23 represented by (36) and roughly estimated by the product of the square of the transconductance and the square of the output resistance of a transistor. From the above, the DC gain of the sub-gain boost amplifying circuit GS1 is roughly estimated by the fourth power of the transconductance and the fourth power of the output resistance of a transistor.

Figure 13:
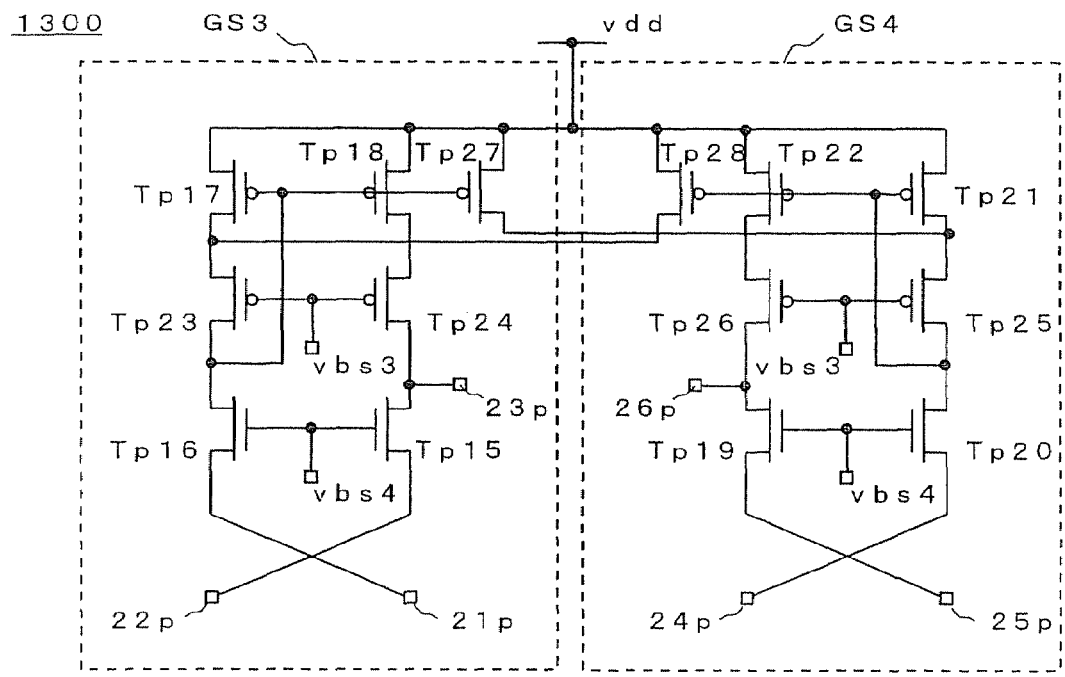
FIG. 13 is a circuit diagram showing one example of sub-gain boost amplifying circuits GS3 and GS4 shown in FIG. 11.

A circuit 1300 shown in FIG. 13 is one example of the circuit configuration of the sub-gain boost amplifying circuits GS3 and GS4, and PMOS transistors T27p and T28p are added to the sub-gain boost amplifying circuits GS3 and GS4 shown in FIG. 8, respectively. Between the circuit 1200 and the circuit 1300, their circuit configurations and connection relations are equal except for the difference between PMOS and NMOS, and the NMOS transistors T27 and T28 correspond to the PMOS transistors T27p and T28, respectively. Therefore, the DC gains of the sub-gain boost amplifying circuit GS3 and GS4 shown in FIG. 13 are equal to that of the sub-gain boost amplifying circuit GS1 shown in FIG. 12 and roughly estimated by the product of the fourth power of the transconductance and the fourth power of the output resistance of a transistor.

From the above, the DC gains of the sub-gain boost amplifying circuits 1200 and 1300 are larger than the DC gains of the sub-gain boost amplifying circuits 600 and 1000 shown in FIG. 8 and FIG. 10. Accordingly, even where the sub-gain boost amplifying circuits 1200 and 1300 are used in the gain boost amplifying circuits G1 and G2 shown in FIG. 7 and FIG. 9, a DC gain larger than that of the gain boost amplifying circuit 1400 as the comparative reference example can be obtained.

Further, since there is no current increase due to addition of the NMOS transistors T27 and T28, the total current is smaller by the current flowing through the transistor TJ6 of the gain boost amplifying circuit 1400, resulting in lower power consumption. From the above, the use of the sub-gain boost amplifying circuit used in this embodiment makes it possible to obtain the gain boost amplifying circuit whose power consumption is reduced as well as whose DC gain is larger than that of the gain boost amplifying circuit 1400.

Another Embodiment

Next, one application of the differential amplifying circuit according to each of the embodiments described above will be described with reference to FIG. 16.

Figure 16:
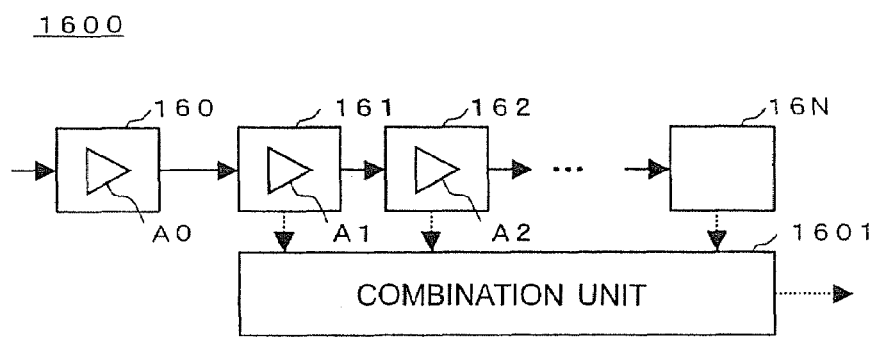
FIG. 16 is a block diagram showing a configuration of a pipelined A/D converter to which the differential amplifying circuit according to the embodiments can be applied.

A pipelined A/D converter 1600 shown in FIG. 16 includes a sample-and-hold circuit 160 which converts an inputted continuous-time analog signal into a discrete-time analog signal and outputs it, respective conversion stages 161, 162, . . . , 16N which each converts the input analog signal into a quantized signal, and a combination unit 1601 which combines quantized signals outputted from the respective conversion stages and outputs an output digital signal.

Each of the conversion stages 161, . . . , quantizes the input analog signal and outputs the quantized signal, and simultaneously decodes this signal and generates a decoded analog signal. Then, it subtracts the decoded analog signal from the input analog signal, amplifiers the resultant signal by a predetermined gain, and supplies the resultant signal to the next conversion stage. Differential amplifying circuit A1, A2, . . . are used to subtract the decoded analog signal from the input analog signal and amplify the resultant signal by the predetermined gain. Also in the sample-and-hold circuit 160, a differential amplifying circuit A0 is used. The differential amplifying circuit in each of the embodiments described above is suitable as these differential amplifying circuits A1, A2, . . . , or differential amplifying circuit A0. Namely, this can realize a low power consumption pipelined A/D converting circuit.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A pipeline A/D converter, comprising:
a sample-and-hold unit which converts an inputted continuous-time analog signal into a discrete-time analog signal; and
an A/D converter unit which converts the discrete-time analog signal into a plurality of quantized values, the A/D converter unit having a plurality of A/D conversion stages connected in series, the A/D conversion stage converts an inputted analog signal into the quantized value,
wherein at least one of the sample-and-hold unit and the A/D conversion stage has a differential amplifying circuit which includes:
an input stage including a pair of differential input terminals and a pair of differential output nodes outputting differential currents according to differential voltages inputted to the pair of differential input terminals;

a first intermediate stage including a first transistor and a first amplifying circuit, the first transistor having a source to which one of the pair of differential output nodes and an input side of the first amplifying circuit are connected, a gate to which an output side of the first amplifying circuit is connected, and a drain being a negative-side current output node;

a second intermediate stage including a second transistor and a second amplifying circuit, the second transistor having a source to which another of the pair of differential output nodes and an input side of the second amplifying circuit are connected, a gate to which an output side of the second amplifying circuit is connected, and a drain being a positive-side current output node; and an output stage using the negative-side current output node and the positive-side current output node as a pair of differential input nodes and including a pair of differential output terminals outputting differential voltages according to differential currents inputted to the pair of differential input nodes, wherein the first amplifying circuit includes:

a first and second current source circuits whose one ends are connected to a first reference potential;

a third transistor having a source to which one of the differential output nodes in the input stage is connected and a gate to which a bias voltage is applied, and across which a bias current flows caused by the first current source circuit;

a fourth transistor having a source connected to a second reference potential, a drain to which a current is inputted from the third transistor, and a gate connected to a drain of the third transistor;

a fifth transistor having a gate and a source connected in common with those of the fourth transistor respectively and a drain to which a current from the second current source circuit is inputted; and a sixth transistor having a gate and a source connected in common with those of the fourth transistor respectively, wherein the source of the third transistor is the input of the first amplifying circuit, and the output of the first amplifying circuit is on a drain side of the fifth transistor;

wherein the second amplifying circuit includes:

a third and fourth current source circuits whose one ends are connected to the first reference potential;

a seventh transistor having a source to which another of the differential output nodes in the input stage is connected and a gate to which a bias voltage is applied, and across which a bias current flows caused by the third current source circuit;

an eighth transistor having a source connected to the second reference potential, a drain to which a current is inputted from the seventh transistor, and a gate connected to a drain of the seventh transistor;

a ninth transistor having a gate and a source connected in common with those of the eighth transistor respectively and a drain to which a current from the fourth current source circuit is inputted; and a tenth transistor having a gate and a source connected in common with those of the eighth transistor respectively, wherein the source of the seventh transistor is the input of the second amplifying circuit, and the output of the second amplifying circuit is on a drain side of the ninth transistor;

wherein a drain of the sixth transistor is connected to the drain of the eighth transistor, and a drain of the tenth transistor is connected to the drain of the fourth transistor;

wherein a ratio between a total of gate widths converted per unit gate length of the fourth and the tenth transistor and a gate width converted per unit gate length of the fifth transistor is nearly proportional to a current ratio between the first current source circuit and the second current source circuit, the gate width converted per unit gate length of the fourth transistor being equal to or more than the gate width converted per unit gate length of the tenth transistor; and wherein a ratio between a total of gate widths converted per unit gate length of the eighth and the sixth transistor and a gate width converted per unit gate length of the ninth transistor is nearly proportional to a current ratio between the third current source circuit and the fourth current source circuit, the gate width converted per unit gate length of the eighth transistor being equal to or more than the gate width converted per unit gate length of the sixth transistor.

2. The pipeline A/D converter according to claim 1, wherein the first amplifying circuit further includes:

an eleventh transistor having a source connected to the drain of the fourth transistor and a gate to which a bias voltage is applied, and across which a bias current flows caused by the first current source; and a twelfth transistor having a source connected to the drain of the fifth transistor and a gate to which a bias voltage is applied, and across which a bias current flows caused by the second current source, wherein the output of the first amplifying circuit is at a drain of the twelfth transistor, and wherein the second amplifying circuit further includes:

a thirteenth transistor having a source connected to the drain of the eighth transistor and a gate to which a bias voltage is applied, and across which a bias current flows caused by the third current source; and a fourteenth transistor having a source connected to the drain of the ninth transistor and a gate to which a bias voltage is applied, and across which a bias current flows caused by the fourth current source, wherein the output of the second amplifying circuit is at a drain of the fourteenth transistor.

3. The pipeline A/D converter according to claim 1, wherein the first amplifying circuit further includes a twelfth transistor having a source connected to the drain of the fifth transistor and a gate to which a bias voltage is applied, and across which a bias current flows caused by the second current source, and the output of the first amplifying circuit is at a drain of the twelfth transistor, and wherein the second amplifying circuit further includes a fourteenth transistor having a source connected to the drain of the ninth transistor and a gate to which a bias voltage is applied, and across which a bias current flows caused by the fourth current source, and the output of the second amplifying circuit is at a drain of the fourteenth transistor.

4. A pipeline A/D converter, comprising:

a sample-and-hold unit which converts an inputted continuous-time analog signal into a discrete-time analog signal; and an A/D converter unit which converts the discrete-time analog signal into a plurality of quantized values, the A/D converter unit having a plurality of A/D conversion stages connected in series, the A/D conversion stage converts an inputted analog signal into the quantized value, wherein at least one of the sample-and-hold unit and the A/D conversion stage has a differential amplifying circuit which includes:

an input stage including a pair of differential input terminals and a pair of differential output nodes outputting differential currents according to differential voltages inputted to the pair of differential input terminals;

a first intermediate stage including a first transistor and a first amplifying circuit, the first transistor having a source to which one of the pair of differential output nodes and an input side of the first amplifying circuit are connected, a gate to which an output side of the first amplifying circuit is connected, and a drain being a negative-side current output node;

a second intermediate stage including a second transistor and a second amplifying circuit, the second transistor having a source to which another of the pair of differential output nodes and an input side of the second amplifying circuit are connected, a gate to which an output side of the second amplifying circuit is connected, and a drain being a positive-side current output node; and an output stage using the negative-side current output node and the positive-side current output node as a pair of differential input nodes and including a pair of differential output terminals outputting differential voltages according to differential currents inputted to the pair of differential input nodes, wherein the first amplifying circuit includes:
a first and second current source circuits whose one ends are connected to a first reference potential;
a third transistor having a source to which one of the differential output nodes in the input stage is connected and a gate to which a bias voltage is applied, and across which a bias current flows caused by the first current source circuit;
a fourth transistor having a source connected to a second reference potential, a drain to which a current is inputted from the third transistor, and a gate connected to a drain of the third transistor;
a fifth transistor having a gate and a source connected in common with those of the fourth transistor respectively and a drain to which a current from the second current source circuit is inputted;
an eleventh transistor having a source connected to the drain of the fourth transistor and a gate to which a bias voltage is applied, and across which a bias current flows caused by the first current source circuit;
a twelfth transistor having a source connected to the drain of the fifth transistor, and across which a bias current flows caused by the second current source circuit; and
a first sub-amplifying circuit configured to perform amplification with the source of the eleventh transistor and the source of the twelfth transistor as bipolar inputs and to supply an output thereof to a gate of the twelfth transistor, wherein the second amplifying circuit includes:
a third and fourth current source circuits whose one ends are connected to the first reference potential;
a seventh transistor having a source to which another of the differential output nodes in the input stage is connected and a gate to which a bias voltage is applied, and across which a bias current flows caused by the third current source circuit;
an eighth transistor having a source connected to the second reference potential, a drain to which a current is inputted from the seventh transistor, and a gate connected to a drain of the seventh transistor;
a ninth transistor having a gate and a source connected in common with those of the eighth transistor respectively and a drain to which a current from the fourth current source circuit is inputted;
a thirteenth transistor having a source connected to the drain of the eighth transistor and a gate to which a bias voltage is applied, and across which a bias current flows caused by the third current source;
a fourteenth transistor having a source connected to the drain of the ninth transistor, and across which a bias current flows caused by the third current source; and
a second sub-amplifying circuit configured to perform amplification using the source of the thirteenth transistor and the source of the fourteenth transistor as bipolar inputs and to supply an output thereof to a gate of the fourteenth transistor, and wherein the first sub-amplifying circuit of the first amplifying circuit includes:
a fifteenth transistor having a source used as one of the bipolar inputs and a gate to which a bias voltage is applied;
a sixteenth transistor having a source used as another of the bipolar inputs and a gate to which a bias voltage is applied;
a seventeenth transistor having a source connected to the second reference potential and a gate connected to a drain of the sixteenth transistor and outputting a drain current to the sixteenth transistor, and
an eighteenth transistor having a source and a gate connected in common with those of the seventeenth transistor respectively and outputting a drain current to the fifteenth transistor, and wherein the second sub-amplifying circuit of the second amplifying circuit includes:
a nineteenth transistor having a source used as one of the bipolar inputs and a gate to which a bias voltage is applied;
a twentieth transistor having a source used as another of the bipolar inputs and a gate to which a bias voltage is applied;
a twenty-first transistor having a source connected to the second reference potential and a gate connected to a drain of the twentieth transistor and outputting a drain current to the twentieth transistor, and
a twenty-second transistor having a source and a gate connected in common with those of the twenty-first transistor respectively and outputting a drain current to the nineteenth transistor.

5. The pipeline A/D converter according to claim 4,
wherein the first sub-amplifying circuit of the first amplifying circuit further includes:
a twenty-third transistor having a source connected to a drain of the seventeenth transistor and a gate to which a bias voltage is applied, and across which a bias current flows caused by a drain current of the seventeenth transistor; and a twenty-fourth transistor having a source connected to a drain of the eighteenth transistor and a gate to which a bias voltage is applied, and across which a bias current flows caused by a drain current of the eighteenth transistor, and wherein the second sub-amplifying circuit of the second amplifying circuit further includes:

a twenty-fifth transistor having a source connected to a drain of the twenty-first transistor and a gate to which a bias voltage is applied, and across which a bias current flows caused by a drain current of the twenty-first transistor; and a twenty-sixth transistor having a source connected to a drain of the twenty-second transistor and a gate to which a bias voltage is applied, and across which a bias current flows caused by a drain current of the twenty-second transistor.

6. The pipeline A/D converter according to claim 4, wherein the first amplifying circuit further includes a sixth transistor having a gate and a source connected in common with those of the fourth transistor respectively;

wherein the second amplifying circuit further includes a tenth transistor having a gate and a source connected in common with those of the eighth transistor respectively;

wherein a drain of the sixth transistor is connected to the drain of the eighth transistor, and a drain of the tenth transistor is connected to the drain of the fourth transistor;

wherein a ratio between a total of gate widths converted per unit gate length of the fourth and the tenth transistor and a gate width converted per unit gate length of the fifth transistor is nearly proportional to a current ratio between the first current source circuit and the second current source circuit, the gate width converted per unit gate length of the fourth transistor being equal to or more than the gate width converted per unit gate length of the tenth transistor; and wherein a ratio between a total of gate widths converted per unit gate length of the eighth and the sixth transistor and a gate width converted per unit gate length of the ninth transistor is nearly proportional to a current ratio between the third current source circuit and the fourth current source circuit, the gate width converted per unit gate length of the eighth transistor being equal to or more than the gate width converted per unit gate length of the sixth transistor.

7. The pipeline A/D converter according to claim 5, wherein the first amplifying circuit further includes a sixth transistor having a gate and a source connected in common with those of the fourth transistor respectively;

wherein the second amplifying circuit further includes a tenth transistor having a gate and a source connected in common with those of the eighth transistor respectively;

wherein a drain of the sixth transistor is connected to the drain of the eighth transistor, and a drain of the tenth transistor is connected to the drain of the fourth transistor;

wherein a ratio between a total of gate widths converted per unit gate length of the fourth and the tenth transistor and a gate width converted per unit gate length of the fifth transistor is nearly proportional to a current ratio between the first current source circuit and the second current source circuit, the gate width converted per unit gate length of the fourth transistor being equal to or more than the gate width converted per unit gate length of the tenth transistor; and wherein a ratio between a total of gate widths converted per unit gate length of the eighth and the sixth transistor and a gate width converted per unit gate length of the ninth transistor is nearly proportional to a current ratio between the third current source circuit and the fourth current source circuit, the gate width converted per unit gate length of the eighth transistor being equal to or more than the gate width converted per unit gate length of the sixth transistor.

8. The pipeline A/D converter according to claim 6, wherein the first sub-amplifying circuit of the first amplifying circuit further includes a twenty-seventh transistor having a gate and a source connected in common with those of the seventeenth transistor respectively;

wherein the second sub-amplifying circuit of the second amplifying circuit further includes a twenty-eighth transistor having a gate and a source connected in common with those of the twenty-first transistor respectively;

wherein a drain of the twenty-seventh transistor is connected to a drain of the twenty-first transistor, and a drain of the twenty-eighth transistor is connected to a drain of the seventeenth transistor;

wherein a gate width converted per unit gate length of the seventeenth transistor is equal to or more than a gate width converted per unit gate length of the twenty-eighth transistor; and wherein a gate width converted per unit gate length of the twenty-first transistor is equal to or more than a gate width converted per unit gate length of the twenty-seventh transistor.

9. The pipeline A/D converter according to claim 7, wherein the first sub-amplifying circuit of the first amplifying circuit further includes a twenty-seventh transistor having a gate and a source connected in common with those of the seventeenth transistor respectively;

wherein the second sub-amplifying circuit of the second amplifying circuit further includes a twenty-eighth transistor having a gate and a source connected in common with those of the twenty-first transistor respectively;

wherein a drain of the twenty-seventh transistor is connected to a drain of the twenty-first transistor, and a drain of the twenty-eighth transistor is connected to a drain of the seventeenth transistor;

wherein a gate width converted per unit gate length of the seventeenth transistor is equal to or more than a gate width converted per unit gate length of the twenty-eighth transistor; and wherein a gate width converted per unit gate length of the twenty-first transistor is equal to or more than a gate width converted per unit gate length of the twenty-seventh transistor.

10. The pipeline A/D converter according to claim 5, wherein the first sub-amplifying circuit of the first amplifying circuit further includes a twenty-seventh transistor having a gate and a source connected in common with those of the seventeenth transistor respectively;

wherein the second sub-amplifying circuit of the second amplifying circuit further includes a twenty-eighth transistor having a gate and a source connected in common with those of the twenty-first transistor respectively;

wherein a drain of the twenty-seventh transistor is connected to a drain of the twenty-first transistor, and a drain of the twenty-eighth transistor is connected to a drain of the seventeenth transistor;

wherein a gate width converted per unit gate length of the seventeenth transistor is equal to or more than a gate width converted per unit gate length of the twenty-eighth transistor; and wherein a gate width converted per unit gate length of the twenty-first transistor is equal to or more than a gate width converted per unit gate length of the twenty-seventh transistor.

11. The pipeline A/D converter according to claim 4, wherein the first sub-amplifying circuit of the first amplifying circuit further includes a twenty-seventh transistor having a gate and a source connected in common with those of the seventeenth transistor respectively;

wherein the second sub-amplifying circuit of the second amplifying circuit further includes a twenty-eighth transistor having a gate and a source connected in common with those of the twenty-first transistor respectively;

wherein a drain of the twenty-seventh transistor is connected to a drain of the twenty-first transistor, and a drain of the twenty-eighth transistor is connected to a drain of the seventeenth transistor;

wherein a gate width converted per unit gate length of the seventeenth transistor is equal to or more than a gate width converted per unit gate length of the twenty-eighth transistor; and wherein a gate width converted per unit gate length of the twenty-first transistor is equal to or more than a gate width converted per unit gate length of the twenty-seventh transistor.

12. The pipeline A/D converter according to claim 2, wherein the first, second, third, and fourth current source circuits each includes a transistor.

13. The pipeline A/D converter according to claim 4, wherein the first, second, third, and fourth current source circuits each includes a transistor.

14. The pipeline A/D converter according to claim 5, wherein the first, second, third, and fourth current source circuits each includes a transistor.

15. The pipeline A/D converter according to claim 6, wherein the first, second, third, and fourth current source circuits each includes a transistor.

16. The pipeline A/D converter according to claim 7, wherein the first, second, third, and fourth current source circuits each includes a transistor.

17. The pipeline A/D converter according to claim 8, wherein the first, second, third, and fourth current source circuits each includes a transistor.

18. The pipeline A/D converter according to claim 9, wherein the first, second, third, and fourth current source circuits each includes a transistor.

19. The pipeline A/D converter according to claim 10, wherein the first, second, third, and fourth current source circuits each includes a transistor.

20. The pipeline A/D converter according to claim 11, wherein the first, second, third, and fourth current source circuits each includes a transistor.

\* \* \* \* \*